United States Patent
Thadani et al.

(10) Patent No.: US 9,412,581 B2
(45) Date of Patent: Aug. 9, 2016

(54) LOW-K DIELECTRIC GAPFILL BY FLOWABLE DEPOSITION

(71) Applicant: Applied Materials, Inc., Santa Clara, CA (US)

(72) Inventors: Kiran V. Thadani, Sunnyvale, CA (US); Jingmei Liang, San Jose, CA (US); Young S. Lee, San Jose, CA (US); Mukund Srinivasan, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/333,262

(22) Filed: Jul. 16, 2014

(65) Prior Publication Data

US 2016/0020089 A1    Jan. 21, 2016

(51) Int. Cl.
| | |
|---|---|
| *C23C 16/452* | (2006.01) |
| *C23C 16/56* | (2006.01) |
| *H01L 21/3105* | (2006.01) |
| *H01L 21/316* | (2006.01) |
| *H01L 21/02* | (2006.01) |

(52) U.S. Cl.
CPC .... *H01L 21/02126* (2013.01); *H01L 21/02216* (2013.01); *H01L 21/02271* (2013.01)

(58) Field of Classification Search
CPC ................ C23C 16/045; C23C 16/401; H01L 21/02126; H01L 21/02129
USPC ............... 438/424, 435, 788; 257/E21.24, 257/E21.241, E21.277
See application file for complete search history.

(56) References Cited

U.S. PATENT DOCUMENTS

| | | | |
|---|---|---|---|
| 4,147,571 | A | 4/1979 | Stringfellow et al. |
| 4,200,666 | A | 4/1980 | Reinberg |
| 4,816,098 | A | 3/1989 | Davis et al. |
| 4,818,326 | A | 4/1989 | Liu et al. |

(Continued)

FOREIGN PATENT DOCUMENTS

| | | |
|---|---|---|
| CN | 1830072 A | 9/2006 |
| DE | 19654737 A1 | 7/1997 |

(Continued)

OTHER PUBLICATIONS

Alexandrov, Sergei E., et al., "Formation of Silicon Nitride Films by Remote Plasma-enhanced Chemical Vapour Deposition". Advanced Materials for Optics and Electronics, vol. 2, 301-312 (1993).

(Continued)

*Primary Examiner* — Kimberly Rizkallah
*Assistant Examiner* — Brian Turner
(74) *Attorney, Agent, or Firm* — Kilpatrick Townsend & Stockton LLP

(57) ABSTRACT

Methods are described for forming a flowable low-k dielectric layer on a patterned substrate. The film may be a silicon-carbon-oxygen (Si—C—O) layer in which the silicon and carbon constituents come from a silicon and carbon containing precursor while the oxygen may come from an oxygen-containing precursor activated in a remote plasma region. A similarly deposited silicon oxide layer may be deposited first to improve the gapfill capabilities. Alternatively, or in combination, the flow of a silicon-and-carbon-containing precursor may be reduced during deposition to change the properties from low-k to high strength roughly following the filling of features of the patterned substrate.

7 Claims, 6 Drawing Sheets

(56) References Cited

U.S. PATENT DOCUMENTS

| | | |
|---|---|---|
| 4,848,400 A | 7/1989 | Grant et al. |
| 4,910,043 A | 3/1990 | Freeman et al. |
| 4,931,354 A | 6/1990 | Wakino et al. |
| 4,946,593 A | 8/1990 | Pinigis |
| 5,016,332 A | 5/1991 | Reichelderfer et al. |
| 5,081,069 A | 1/1992 | Parker et al. |
| 5,110,407 A | 5/1992 | Ono et al. |
| 5,125,360 A | 6/1992 | Nakayama et al. |
| 5,148,714 A | 9/1992 | McDiarmid |
| 5,212,119 A | 5/1993 | Hah et al. |
| 5,252,178 A | 10/1993 | Moslehi |
| 5,279,784 A | 1/1994 | Bender et al. |
| 5,304,250 A | 4/1994 | Sameshima et al. |
| 5,328,558 A | 7/1994 | Kawamura |
| 5,364,488 A | 11/1994 | Minato et al. |
| 5,393,708 A | 2/1995 | Hsia et al. |
| 5,412,180 A | 5/1995 | Coombs |
| 5,434,109 A | 7/1995 | Geissler et al. |
| 5,443,647 A | 8/1995 | Aucoin et al. |
| 5,468,687 A | 11/1995 | Carl et al. |
| 5,485,420 A | 1/1996 | Lage et al. |
| 5,530,293 A | 6/1996 | Cohen et al. |
| 5,547,703 A | 8/1996 | Camilletti et al. |
| 5,558,717 A | 9/1996 | Zhao et al. |
| 5,569,350 A | 10/1996 | Osada et al. |
| 5,578,532 A | 11/1996 | van de Ven et al. |
| 5,587,014 A | 12/1996 | Iyechika et al. |
| 5,620,525 A | 4/1997 | van de Ven et al. |
| 5,622,784 A | 4/1997 | Okaue et al. |
| 5,630,881 A | 5/1997 | Ogure et al. |
| 5,635,409 A | 6/1997 | Moslehi |
| 5,665,643 A | 9/1997 | Shin |
| 5,683,518 A | 11/1997 | Moore et al. |
| 5,691,009 A | 11/1997 | Sandhu |
| 5,769,951 A | 6/1998 | van de Ven et al. |
| 5,786,263 A | 7/1998 | Perera |
| 5,811,325 A | 9/1998 | Lin et al. |
| 5,812,403 A | 9/1998 | Fong et al. |
| 5,843,233 A | 12/1998 | van de Ven et al. |
| 5,853,607 A | 12/1998 | Zhao et al. |
| 5,882,414 A | 3/1999 | Fong et al. |
| 5,882,417 A | 3/1999 | van de Ven et al. |
| 5,902,407 A | 5/1999 | deBoer et al. |
| 5,925,411 A | 7/1999 | van de Ven et al. |
| 5,926,737 A | 7/1999 | Ameen et al. |
| 5,935,340 A | 8/1999 | Xia et al. |
| 5,961,850 A | 10/1999 | Satou et al. |
| 5,966,595 A | 10/1999 | Thakur et al. |
| 6,008,515 A | 12/1999 | Hsia et al. |
| 6,009,830 A | 1/2000 | Li et al. |
| 6,014,979 A | 1/2000 | Van Autryve et al. |
| 6,017,791 A | 1/2000 | Wang et al. |
| 6,021,785 A | 2/2000 | Grutzediek et al. |
| 6,024,044 A | 2/2000 | Law et al. |
| 6,074,696 A | 6/2000 | Sato |
| 6,077,412 A | 6/2000 | Ting et al. |
| 6,087,243 A | 7/2000 | Wang |
| 6,090,442 A | 7/2000 | Klaus et al. |
| 6,110,838 A | 8/2000 | Loewenstein |
| 6,114,219 A | 9/2000 | Spikes, Jr. et al. |
| 6,121,130 A | 9/2000 | Chua et al. |
| 6,146,970 A | 11/2000 | Witek et al. |
| 6,148,761 A | 11/2000 | Majewski et al. |
| 6,156,394 A | 12/2000 | Yamasaki et al. |
| 6,156,581 A | 12/2000 | Vaudo et al. |
| 6,165,834 A | 12/2000 | Agarwal et al. |
| 6,180,490 B1 | 1/2001 | Vassiliev et al. |
| 6,187,682 B1 | 2/2001 | Denning et al. |
| 6,191,004 B1 | 2/2001 | Hsiao |
| 6,203,657 B1 | 3/2001 | Collison et al. |
| 6,207,587 B1 | 3/2001 | Li et al. |
| 6,211,040 B1 | 4/2001 | Liu et al. |
| 6,258,690 B1 | 7/2001 | Zenke |
| 6,287,962 B1 | 9/2001 | Lin |
| 6,296,255 B1 | 10/2001 | Hashimoto |
| 6,339,997 B1 | 1/2002 | Nakagawa et al. |
| 6,355,581 B1 | 3/2002 | Vassiliev et al. |
| 6,383,954 B1 | 5/2002 | Wang et al. |
| 6,387,207 B1 | 5/2002 | Janakiraman et al. |
| 6,406,677 B1 | 6/2002 | Carter et al. |
| 6,413,583 B1 | 7/2002 | Moghadam et al. |
| 6,448,187 B1 | 9/2002 | Yau et al. |
| 6,450,117 B1 | 9/2002 | Murugesh et al. |
| 6,469,283 B1 | 10/2002 | Burkhart et al. |
| 6,503,557 B1 | 1/2003 | Joret |
| 6,506,253 B2 | 1/2003 | Sakuma |
| 6,508,879 B1 | 1/2003 | Hashimoto |
| 6,524,931 B1 | 2/2003 | Perera |
| 6,528,332 B2 | 3/2003 | Mahanpour et al. |
| 6,548,416 B2 | 4/2003 | Han et al. |
| 6,566,278 B1 | 5/2003 | Harvey et al. |
| 6,583,063 B1 | 6/2003 | Khan et al. |
| 6,583,069 B1 | 6/2003 | Vassiliev et al. |
| 6,599,839 B1 | 7/2003 | Gabriel et al. |
| 6,602,806 B1 | 8/2003 | Xia et al. |
| 6,614,181 B1 | 9/2003 | Harvey et al. |
| 6,645,303 B2 | 11/2003 | Frankel et al. |
| 6,656,804 B2 | 12/2003 | Tsujikawa et al. |
| 6,660,391 B1 | 12/2003 | Rose et al. |
| 6,660,662 B2 | 12/2003 | Ishikawa et al. |
| 6,667,553 B2 | 12/2003 | Cerny et al. |
| 6,670,284 B2 | 12/2003 | Yin |
| 6,676,751 B2 | 1/2004 | Solomon et al. |
| 6,682,659 B1 | 1/2004 | Cho et al. |
| 6,682,969 B1 | 1/2004 | Basceri et al. |
| 6,683,364 B2 | 1/2004 | Oh et al. |
| 6,706,634 B1 | 3/2004 | Seitz et al. |
| 6,716,770 B2 | 4/2004 | O'Neill et al. |
| 6,758,224 B2 | 7/2004 | Nogami |
| 6,762,126 B2 | 7/2004 | Cho et al. |
| 6,787,191 B2 | 9/2004 | Hanahata et al. |
| 6,800,571 B2 | 10/2004 | Cheung et al. |
| 6,812,157 B1 | 11/2004 | Gadgil |
| 6,818,517 B1 | 11/2004 | Maes |
| 6,819,886 B2 | 11/2004 | Runkowske et al. |
| 6,830,624 B2 | 12/2004 | Janakiraman et al. |
| 6,833,052 B2 | 12/2004 | Li et al. |
| 6,833,322 B2 | 12/2004 | Anderson et al. |
| 6,833,578 B1 | 12/2004 | Tu et al. |
| 6,835,278 B2 | 12/2004 | Selbrede et al. |
| 6,849,520 B2 | 2/2005 | Kim et al. |
| 6,858,523 B2 | 2/2005 | DeBoer et al. |
| 6,858,533 B2 | 2/2005 | Chu et al. |
| 6,872,323 B1 | 3/2005 | Entley et al. |
| 6,875,687 B1 | 4/2005 | Weidman et al. |
| 6,884,685 B2 | 4/2005 | Luo et al. |
| 6,890,403 B2 | 5/2005 | Cheung et al. |
| 6,900,067 B2 | 5/2005 | Kobayashi et al. |
| 6,935,466 B2 | 8/2005 | Lubomirsky et al. |
| 6,955,836 B2 | 10/2005 | Kumagai et al. |
| 6,958,112 B2 | 10/2005 | Karim et al. |
| 7,018,902 B2 | 3/2006 | Visokay et al. |
| 7,077,904 B2 | 7/2006 | Cho et al. |
| 7,084,076 B2 | 8/2006 | Park et al. |
| 7,087,497 B2 | 8/2006 | Yuan et al. |
| 7,109,114 B2 | 9/2006 | Chen et al. |
| 7,115,419 B2 | 10/2006 | Suzuki |
| 7,122,222 B2 | 10/2006 | Xiao et al. |
| 7,129,185 B2 | 10/2006 | Aoyama et al. |
| 7,148,155 B1 | 12/2006 | Tarafdar et al. |
| 7,183,177 B2 | 2/2007 | Al-Bayati et al. |
| 7,192,626 B2 | 3/2007 | Dussarrat et al. |
| 7,205,248 B2 | 4/2007 | Li et al. |
| 7,220,461 B2 | 5/2007 | Hasebe et al. |
| 7,297,608 B1 | 11/2007 | Papasouliotis et al. |
| 7,399,388 B2 | 7/2008 | Moghadam et al. |
| 7,419,903 B2 | 9/2008 | Haukka et al. |
| 7,435,661 B2 | 10/2008 | Miller et al. |
| 7,456,116 B2 | 11/2008 | Ingle et al. |
| 7,479,210 B2 | 1/2009 | Mullapudi et al. |
| 7,498,273 B2 | 3/2009 | Mallick et al. |
| 7,514,375 B1 | 4/2009 | Shanker et al. |
| 7,521,378 B2 | 4/2009 | Fucsko et al. |
| 7,524,735 B1 | 4/2009 | Gauri et al. |

(56) References Cited

U.S. PATENT DOCUMENTS

| | | |
|---|---|---|
| 7,524,750 B2 | 4/2009 | Nemani et al. |
| 7,541,297 B2 | 6/2009 | Mallick et al. |
| 7,622,369 B1 | 11/2009 | Lee et al. |
| 7,745,352 B2 | 6/2010 | Mallick et al. |
| 7,749,574 B2 | 7/2010 | Mahajani et al. |
| 7,790,634 B2 | 9/2010 | Munro et al. |
| 7,803,722 B2 | 9/2010 | Liang |
| 7,825,038 B2 | 11/2010 | Ingle et al. |
| 7,825,044 B2 | 11/2010 | Mallick et al. |
| 7,867,923 B2 | 1/2011 | Mallick et al. |
| 7,902,080 B2 | 3/2011 | Chen et al. |
| 7,915,139 B1 | 3/2011 | Lang et al. |
| 7,935,643 B2 | 5/2011 | Liang et al. |
| 7,943,514 B2 | 5/2011 | West |
| 7,943,531 B2 | 5/2011 | Nemani et al. |
| 7,964,040 B2 | 6/2011 | Rasheed et al. |
| 7,989,365 B2 | 8/2011 | Park et al. |
| 7,994,019 B1 | 8/2011 | Kweskin et al. |
| 8,119,544 B2 | 2/2012 | Hasebe et al. |
| 8,129,555 B2 | 3/2012 | Cheng et al. |
| 8,232,176 B2 | 7/2012 | Lubomirsky et al. |
| 8,236,708 B2 | 8/2012 | Kweskin et al. |
| 8,242,031 B2 | 8/2012 | Mallick et al. |
| 8,264,066 B2 | 9/2012 | Lo et al. |
| 8,304,351 B2 | 11/2012 | Wang et al. |
| 8,318,584 B2 | 11/2012 | Li et al. |
| 8,445,078 B2 | 5/2013 | Liang et al. |
| 8,449,942 B2 | 5/2013 | Liang et al. |
| 8,466,067 B2 | 6/2013 | Liang et al. |
| 8,466,073 B2 | 6/2013 | Wang et al. |
| 2001/0006070 A1 | 7/2001 | Shang et al. |
| 2001/0021595 A1 | 9/2001 | Jang |
| 2001/0024691 A1 | 9/2001 | Kimura et al. |
| 2001/0029114 A1 | 10/2001 | Vulpio et al. |
| 2001/0029892 A1 | 10/2001 | Cook et al. |
| 2001/0038919 A1 | 11/2001 | Berry et al. |
| 2001/0040099 A1 | 11/2001 | Pederson et al. |
| 2001/0042511 A1 | 11/2001 | Liu et al. |
| 2001/0048980 A1 | 12/2001 | Kishimoto et al. |
| 2001/0054387 A1 | 12/2001 | Frankel et al. |
| 2001/0055889 A1 | 12/2001 | Iyer |
| 2002/0000202 A1 | 1/2002 | Yuda et al. |
| 2002/0027286 A1 | 3/2002 | Sundararajan et al. |
| 2002/0048969 A1 | 4/2002 | Suzuki et al. |
| 2002/0068416 A1 | 6/2002 | Hsieh et al. |
| 2002/0068466 A1 | 6/2002 | Lee et al. |
| 2002/0079523 A1 | 6/2002 | Zheng et al. |
| 2002/0081817 A1 | 6/2002 | Bhakta et al. |
| 2002/0081842 A1 | 6/2002 | Sambucetti et al. |
| 2002/0086166 A1 | 7/2002 | Hendricks et al. |
| 2002/0119607 A1 | 8/2002 | Miyasaka et al. |
| 2002/0127350 A1 | 9/2002 | Ishikawa et al. |
| 2002/0129769 A1 | 9/2002 | Kim et al. |
| 2002/0139307 A1 | 10/2002 | Ryding et al. |
| 2002/0142585 A1 | 10/2002 | Mandal |
| 2002/0146879 A1 | 10/2002 | Fu et al. |
| 2002/0160585 A1 | 10/2002 | Park |
| 2002/0163637 A1 | 11/2002 | Rossman et al. |
| 2002/0164421 A1 | 11/2002 | Chiang et al. |
| 2002/0164429 A1 | 11/2002 | Gaillard et al. |
| 2002/0164891 A1 | 11/2002 | Gates et al. |
| 2002/0177298 A1 | 11/2002 | Konishi et al. |
| 2002/0182893 A1 | 12/2002 | Ballantine et al. |
| 2002/0185067 A1 | 12/2002 | Upham |
| 2002/0189760 A1 | 12/2002 | Park |
| 2003/0001201 A1 | 1/2003 | Yuzuriha et al. |
| 2003/0023113 A1 | 1/2003 | Druzkowski et al. |
| 2003/0040199 A1 | 2/2003 | Agarwal |
| 2003/0064154 A1 | 4/2003 | Laxman et al. |
| 2003/0073310 A1 | 4/2003 | Olgado et al. |
| 2003/0077918 A1 | 4/2003 | Wu et al. |
| 2003/0094773 A1 | 5/2003 | Lerner |
| 2003/0113992 A1 | 6/2003 | Yau et al. |
| 2003/0118748 A1 | 6/2003 | Kumagai et al. |
| 2003/0124873 A1 | 7/2003 | Xing et al. |
| 2003/0143328 A1 | 7/2003 | Chen et al. |
| 2003/0172872 A1 | 9/2003 | Thakur et al. |
| 2003/0194881 A1 | 10/2003 | Totsuka et al. |
| 2003/0199151 A1 | 10/2003 | Ho et al. |
| 2003/0203653 A1 | 10/2003 | Buchanan et al. |
| 2003/0207561 A1 | 11/2003 | Dubin et al. |
| 2003/0219973 A1* | 11/2003 | Townsend et al. ............ 438/631 |
| 2003/0232495 A1 | 12/2003 | Moghadam et al. |
| 2004/0008334 A1 | 1/2004 | Sreenivasan et al. |
| 2004/0020601 A1 | 2/2004 | Zhao et al. |
| 2004/0029352 A1 | 2/2004 | Beyer et al. |
| 2004/0048492 A1 | 3/2004 | Ishikawa et al. |
| 2004/0065253 A1 | 4/2004 | Tois et al. |
| 2004/0082131 A1 | 4/2004 | Tsujikawa et al. |
| 2004/0083967 A1 | 5/2004 | Yuda et al. |
| 2004/0084680 A1 | 5/2004 | Ruelke et al. |
| 2004/0094091 A1 | 5/2004 | Yang et al. |
| 2004/0110354 A1 | 6/2004 | Natzle et al. |
| 2004/0134773 A1 | 7/2004 | Pederson et al. |
| 2004/0139983 A1 | 7/2004 | Lakshmanan et al. |
| 2004/0144490 A1 | 7/2004 | Zhao et al. |
| 2004/0152342 A1 | 8/2004 | Li et al. |
| 2004/0159343 A1 | 8/2004 | Shimbara et al. |
| 2004/0161899 A1 | 8/2004 | Luo et al. |
| 2004/0166680 A1 | 8/2004 | Miyajima et al. |
| 2004/0175501 A1 | 9/2004 | Lukas et al. |
| 2004/0180557 A1 | 9/2004 | Park et al. |
| 2004/0183202 A1 | 9/2004 | Usami |
| 2004/0185641 A1 | 9/2004 | Tanabe et al. |
| 2004/0194706 A1 | 10/2004 | Wang et al. |
| 2004/0197843 A1 | 10/2004 | Chou et al. |
| 2004/0206305 A1 | 10/2004 | Choi et al. |
| 2004/0211664 A1 | 10/2004 | Wang |
| 2004/0219780 A1 | 11/2004 | Ohuchi |
| 2004/0224534 A1 | 11/2004 | Beulens et al. |
| 2004/0231590 A1 | 11/2004 | Ovshinsky |
| 2004/0231799 A1 | 11/2004 | Lee et al. |
| 2004/0241342 A1 | 12/2004 | Karim et al. |
| 2004/0253826 A1 | 12/2004 | Ivanov et al. |
| 2005/0001556 A1 | 1/2005 | Hoffman et al. |
| 2005/0014354 A1 | 1/2005 | Ozawa et al. |
| 2005/0019494 A1 | 1/2005 | Moghadam et al. |
| 2005/0026443 A1 | 2/2005 | Goo et al. |
| 2005/0042889 A1 | 2/2005 | Lee et al. |
| 2005/0062165 A1 | 3/2005 | Saenger et al. |
| 2005/0087140 A1 | 4/2005 | Yuda et al. |
| 2005/0112901 A1 | 5/2005 | Ji et al. |
| 2005/0118794 A1 | 6/2005 | Babayan et al. |
| 2005/0121145 A1 | 6/2005 | Du Bois et al. |
| 2005/0153574 A1 | 7/2005 | Mandal |
| 2005/0160974 A1 | 7/2005 | Ivanov et al. |
| 2005/0181555 A1 | 8/2005 | Haukka et al. |
| 2005/0186731 A1 | 8/2005 | Derderian et al. |
| 2005/0186789 A1 | 8/2005 | Agarwal |
| 2005/0196533 A1 | 9/2005 | Hasebe et al. |
| 2005/0196935 A1 | 9/2005 | Ishitsuka et al. |
| 2005/0196977 A1 | 9/2005 | Saito et al. |
| 2005/0217578 A1 | 10/2005 | Gurary et al. |
| 2005/0224866 A1 | 10/2005 | Higashi et al. |
| 2005/0227017 A1 | 10/2005 | Senzaki et al. |
| 2005/0227499 A1 | 10/2005 | Park et al. |
| 2005/0230350 A1 | 10/2005 | Kao et al. |
| 2005/0233595 A1 | 10/2005 | Choi et al. |
| 2005/0250340 A1 | 11/2005 | Chen et al. |
| 2005/0257890 A1 | 11/2005 | Park et al. |
| 2005/0260347 A1 | 11/2005 | Narwankar et al. |
| 2005/0287775 A1 | 12/2005 | Hasebe et al. |
| 2006/0014399 A1 | 1/2006 | Joe |
| 2006/0030151 A1 | 2/2006 | Ding et al. |
| 2006/0030165 A1 | 2/2006 | Ingle et al. |
| 2006/0046506 A1 | 3/2006 | Fukiage |
| 2006/0055004 A1 | 3/2006 | Gates et al. |
| 2006/0068599 A1 | 3/2006 | Baek et al. |
| 2006/0075966 A1 | 4/2006 | Chen et al. |
| 2006/0075967 A1 | 4/2006 | Lu et al. |
| 2006/0088985 A1 | 4/2006 | Haverkort et al. |
| 2006/0090694 A1 | 5/2006 | Cho et al. |
| 2006/0091104 A1 | 5/2006 | Takeshita et al. |
| 2006/0096540 A1 | 5/2006 | Choi |

(56) References Cited

U.S. PATENT DOCUMENTS

| | | |
|---|---|---|
| 2006/0102977 A1 | 5/2006 | Fucsko et al. |
| 2006/0105106 A1 | 5/2006 | Balseanu et al. |
| 2006/0110939 A1 | 5/2006 | Joshi et al. |
| 2006/0110943 A1 | 5/2006 | Swerts et al. |
| 2006/0158101 A1 | 7/2006 | Camilletti et al. |
| 2006/0159847 A1 | 7/2006 | Porter et al. |
| 2006/0160372 A1 | 7/2006 | Dorfman |
| 2006/0162661 A1 | 7/2006 | Jung et al. |
| 2006/0178018 A1 | 8/2006 | Olsen |
| 2006/0211265 A1 | 9/2006 | Trott |
| 2006/0223315 A1 | 10/2006 | Yokota et al. |
| 2006/0225648 A1 | 10/2006 | Rasheed et al. |
| 2006/0228903 A1 | 10/2006 | McSwiney et al. |
| 2006/0251499 A1 | 11/2006 | Lunday et al. |
| 2006/0252240 A1 | 11/2006 | Gschwandtner et al. |
| 2006/0263522 A1 | 11/2006 | Byun |
| 2006/0281496 A1 | 12/2006 | Cedraeus |
| 2006/0286774 A1 | 12/2006 | Singh et al. |
| 2006/0286776 A1 | 12/2006 | Ranish et al. |
| 2007/0004170 A1 | 1/2007 | Kawasaki et al. |
| 2007/0010072 A1 | 1/2007 | Bailey et al. |
| 2007/0020392 A1 | 1/2007 | Kobrin et al. |
| 2007/0026689 A1 | 2/2007 | Nakata et al. |
| 2007/0031598 A1 | 2/2007 | Okuyama et al. |
| 2007/0031609 A1 | 2/2007 | Kumar et al. |
| 2007/0032054 A1 | 2/2007 | Ramaswamy et al. |
| 2007/0049044 A1 | 3/2007 | Marsh |
| 2007/0065578 A1 | 3/2007 | McDougall |
| 2007/0066022 A1 | 3/2007 | Chen et al. |
| 2007/0077777 A1 | 4/2007 | Gumpher |
| 2007/0080057 A1 | 4/2007 | Mizohata et al. |
| 2007/0092661 A1 | 4/2007 | Ryuzaki et al. |
| 2007/0099438 A1 | 5/2007 | Ye et al. |
| 2007/0108404 A1 | 5/2007 | Stewart et al. |
| 2007/0111546 A1 | 5/2007 | Iyer et al. |
| 2007/0128864 A1 | 6/2007 | Ma et al. |
| 2007/0134433 A1 | 6/2007 | Dussarrat et al. |
| 2007/0166892 A1 | 7/2007 | Hori |
| 2007/0173073 A1 | 7/2007 | Weber |
| 2007/0181966 A1 | 8/2007 | Watatani et al. |
| 2007/0232071 A1 | 10/2007 | Balseanu et al. |
| 2007/0232082 A1 | 10/2007 | Balseanu et al. |
| 2007/0235062 A1 | 10/2007 | Fujiwara et al. |
| 2007/0275569 A1 | 11/2007 | Moghadam et al. |
| 2007/0277734 A1 | 12/2007 | Lubomirsky et al. |
| 2007/0281106 A1 | 12/2007 | Lubomirsky et al. |
| 2007/0281448 A1 | 12/2007 | Chen et al. |
| 2007/0281495 A1 | 12/2007 | Mallick et al. |
| 2007/0281496 A1* | 12/2007 | Ingle et al. .................... 438/778 |
| 2007/0289534 A1 | 12/2007 | Lubomirsky et al. |
| 2007/0298585 A1 | 12/2007 | Lubomirsky et al. |
| 2008/0000423 A1 | 1/2008 | Fukiage |
| 2008/0014711 A1 | 1/2008 | Choi et al. |
| 2008/0014759 A1 | 1/2008 | Chua et al. |
| 2008/0020591 A1 | 1/2008 | Balseanu et al. |
| 2008/0026597 A1* | 1/2008 | Munro et al. ................. 438/788 |
| 2008/0038486 A1 | 2/2008 | Treichel et al. |
| 2008/0063809 A1 | 3/2008 | Lee et al. |
| 2008/0070409 A1 | 3/2008 | Park et al. |
| 2008/0081104 A1 | 4/2008 | Hasebe et al. |
| 2008/0085607 A1 | 4/2008 | Yu et al. |
| 2008/0096364 A1 | 4/2008 | Wilson et al. |
| 2008/0099431 A1 | 5/2008 | Kumar et al. |
| 2008/0102223 A1 | 5/2008 | Wagner et al. |
| 2008/0102650 A1 | 5/2008 | Adams et al. |
| 2008/0178805 A1 | 7/2008 | Paterson et al. |
| 2008/0182382 A1 | 7/2008 | Ingle et al. |
| 2008/0188087 A1 | 8/2008 | Chen et al. |
| 2008/0206954 A1 | 8/2008 | Choi et al. |
| 2008/0241358 A1 | 10/2008 | Joe et al. |
| 2008/0260969 A1 | 10/2008 | Dussarrat et al. |
| 2008/0305648 A1 | 12/2008 | Fukazawa et al. |
| 2008/0318429 A1 | 12/2008 | Ozawa et al. |
| 2009/0031953 A1 | 2/2009 | Ingle et al. |
| 2009/0035917 A1 | 2/2009 | Ahn et al. |
| 2009/0053901 A1 | 2/2009 | Goto et al. |
| 2009/0054674 A1 | 2/2009 | Lukas et al. |
| 2009/0061647 A1 | 3/2009 | Mallick et al. |
| 2009/0075490 A1 | 3/2009 | Dussarrat et al. |
| 2009/0093132 A1 | 4/2009 | Xu et al. |
| 2009/0095714 A1 | 4/2009 | Chen et al. |
| 2009/0104755 A1 | 4/2009 | Mallick et al. |
| 2009/0104789 A1 | 4/2009 | Mallick et al. |
| 2009/0104790 A1 | 4/2009 | Liang |
| 2009/0104791 A1 | 4/2009 | Nemani et al. |
| 2009/0104798 A1 | 4/2009 | Hirano |
| 2009/0120368 A1 | 5/2009 | Lubomirsky et al. |
| 2009/0120464 A1 | 5/2009 | Rasheed et al. |
| 2009/0120584 A1 | 5/2009 | Lubomirsky et al. |
| 2009/0142935 A1 | 6/2009 | Fukuzawa et al. |
| 2009/0170282 A1 | 7/2009 | Dong |
| 2009/0181550 A1 | 7/2009 | Hasebe et al. |
| 2009/0194809 A1 | 8/2009 | Cho |
| 2009/0203225 A1 | 8/2009 | Gates et al. |
| 2009/0206409 A1 | 8/2009 | Arisumi et al. |
| 2009/0209081 A1 | 8/2009 | Matero et al. |
| 2009/0215251 A1 | 8/2009 | Vellaikal et al. |
| 2009/0224374 A1 | 9/2009 | Bhatia et al. |
| 2009/0232985 A1 | 9/2009 | Dussarrat et al. |
| 2009/0242957 A1 | 10/2009 | Ma et al. |
| 2009/0277587 A1 | 11/2009 | Lubomirsky et al. |
| 2009/0280650 A1 | 11/2009 | Lubomirsky et al. |
| 2009/0289284 A1 | 11/2009 | Goh et al. |
| 2009/0294925 A1 | 12/2009 | Lin et al. |
| 2009/0298257 A1 | 12/2009 | Lee et al. |
| 2009/0325391 A1 | 12/2009 | De Vusser et al. |
| 2010/0052066 A1 | 3/2010 | Yu et al. |
| 2010/0059889 A1 | 3/2010 | Gosset et al. |
| 2010/0081094 A1 | 4/2010 | Hasebe et al. |
| 2010/0081293 A1 | 4/2010 | Mallick et al. |
| 2010/0099236 A1 | 4/2010 | Kwon et al. |
| 2010/0136313 A1 | 6/2010 | Shimizu et al. |
| 2010/0140756 A1 | 6/2010 | Kozasa et al. |
| 2010/0143609 A1 | 6/2010 | Fukazawa et al. |
| 2010/0184302 A1 | 7/2010 | Lee et al. |
| 2010/0190317 A1 | 7/2010 | Iwasawa et al. |
| 2010/0190348 A1 | 7/2010 | Akae et al. |
| 2010/0221428 A1 | 9/2010 | Dussarrat |
| 2010/0221925 A1 | 9/2010 | Lee et al. |
| 2010/0227276 A1 | 9/2010 | Mizuno |
| 2010/0230052 A1 | 9/2010 | Iizuka |
| 2010/0255655 A1 | 10/2010 | Mallick et al. |
| 2010/0261318 A1 | 10/2010 | Feng et al. |
| 2010/0283097 A1 | 11/2010 | Endoh et al. |
| 2011/0014798 A1 | 1/2011 | Mallick et al. |
| 2011/0034035 A1 | 2/2011 | Liang et al. |
| 2011/0034039 A1 | 2/2011 | Liang et al. |
| 2011/0045676 A1 | 2/2011 | Park et al. |
| 2011/0111137 A1 | 5/2011 | Liang et al. |
| 2011/0129616 A1 | 6/2011 | Ingle et al. |
| 2011/0136347 A1 | 6/2011 | Kovarsky et al. |
| 2011/0151677 A1 | 6/2011 | Wang et al. |
| 2011/0159213 A1 | 6/2011 | Cai et al. |
| 2011/0159703 A1 | 6/2011 | Liang et al. |
| 2011/0165347 A1 | 7/2011 | Miller et al. |
| 2011/0165781 A1 | 7/2011 | Liang et al. |
| 2011/0186990 A1 | 8/2011 | Mawatari et al. |
| 2011/0187000 A1 | 8/2011 | West |
| 2011/0217851 A1 | 9/2011 | Liang et al. |
| 2011/0223774 A1 | 9/2011 | Kweskin et al. |
| 2012/0003840 A1 | 1/2012 | Wang et al. |
| 2012/0009802 A1 | 1/2012 | LaVoie et al. |
| 2012/0073501 A1 | 3/2012 | Lubomirsky et al. |
| 2012/0074387 A1 | 3/2012 | King |
| 2012/0079982 A1 | 4/2012 | Lubomirsky et al. |
| 2012/0083133 A1 | 4/2012 | Solis et al. |
| 2012/0094468 A1 | 4/2012 | Bhatia et al. |
| 2012/0094476 A1 | 4/2012 | Tanaka et al. |
| 2012/0111831 A1 | 5/2012 | Ha |
| 2012/0122302 A1 | 5/2012 | Weidman et al. |
| 2012/0142192 A1 | 6/2012 | Li et al. |
| 2012/0145079 A1 | 6/2012 | Lubomirsky et al. |
| 2012/0161405 A1 | 6/2012 | Mohn et al. |
| 2012/0177846 A1 | 7/2012 | Li et al. |

(56) References Cited

U.S. PATENT DOCUMENTS

| | | |
|---|---|---|
| 2012/0180954 A1 | 7/2012 | Yang et al. |
| 2012/0190178 A1 | 7/2012 | Wang et al. |
| 2012/0193778 A1 | 8/2012 | Mawatari |
| 2012/0213940 A1 | 8/2012 | Mallick |
| 2012/0225565 A1 | 9/2012 | Bhatia et al. |
| 2012/0238108 A1 | 9/2012 | Chen et al. |
| 2012/0269989 A1 | 10/2012 | Liang et al. |
| 2012/0292720 A1 | 11/2012 | Chen et al. |
| 2012/0309205 A1 | 12/2012 | Wang et al. |
| 2013/0062736 A1 | 3/2013 | Brighton et al. |
| 2013/0084711 A1 | 4/2013 | Liang et al. |
| 2013/0149462 A1 | 6/2013 | Liang et al. |
| 2013/0193578 A1 | 8/2013 | Yu et al. |

FOREIGN PATENT DOCUMENTS

| | | |
|---|---|---|
| EP | 0892083 A1 | 1/1999 |
| EP | 1095958 B1 | 5/2001 |
| EP | 1469509 A1 | 10/2004 |
| EP | 1717848 A | 11/2006 |
| EP | 1791161 A2 | 5/2007 |
| EP | 2022087 A2 | 5/2007 |
| JP | 57-75738 U | 10/1980 |
| JP | 61-234534 A | 10/1986 |
| JP | 64-048425 A | 2/1989 |
| JP | 1-198033 A | 8/1989 |
| JP | 01-235259 A | 9/1989 |
| JP | 01241826 A | 9/1989 |
| JP | 03-197684 A | 8/1991 |
| JP | 03-286531 | 12/1991 |
| JP | 2004-328825 | 11/1992 |
| JP | 05-259156 | 10/1993 |
| JP | 05-304147 A | 11/1993 |
| JP | 06-077150 A | 3/1994 |
| JP | 6-168930 A | 6/1994 |
| JP | 07-014826 A | 1/1995 |
| JP | 07-169762 A | 7/1995 |
| JP | 07-316823 A | 12/1995 |
| JP | 08-236518 A | 9/1996 |
| JP | 08-288286 A | 11/1996 |
| JP | 09-008014 A | 1/1997 |
| JP | 09-237785 A | 9/1997 |
| JP | 10-163183 A | 6/1998 |
| JP | 11-274285 A | 10/1999 |
| JP | 2001-148382 A | 5/2001 |
| JP | 2002-370059 A | 12/2002 |
| JP | 2003-179054 | 6/2003 |
| JP | 2004-012315 | 1/2004 |
| JP | 2004-327639 | 11/2004 |
| JP | 2004-536444 A | 12/2004 |
| JP | 2005-142448 A | 6/2005 |
| JP | 2005-268396 A | 9/2005 |
| JP | 2005-302848 A | 10/2005 |
| JP | 2006-041539 A | 2/2006 |
| JP | 2006-210878 A | 8/2006 |
| JP | 2007-019067 A | 1/2007 |
| JP | 2007-191728 A | 8/2007 |
| JP | 2007-324154 A | 12/2007 |
| JP | 2008-159824 A | 7/2008 |
| JP | 2008/218684 A | 9/2008 |
| JP | 2011-220127 A | 11/2011 |
| KR | 10-1999-0010957 A | 2/1999 |
| KR | 0204793 B1 | 3/1999 |
| KR | 1020000011360 A | 2/2000 |
| KR | 1020020013383 A | 2/2002 |
| KR | 10-2004-0091978 A | 11/2004 |
| KR | 1020040104533 A | 12/2004 |
| KR | 10-2005-0003758 A | 1/2005 |
| KR | 10-2005-0072332 A | 7/2005 |
| KR | 10-2005-0085838 | 8/2005 |
| KR | 10-2005-0094183 A | 9/2005 |
| KR | 1020060081350 A | 7/2006 |
| KR | 1020060103640 A | 10/2006 |
| KR | 10-2009-0011765 A | 2/2009 |
| KR | 10-2009-0121361 | 11/2009 |
| KR | 10-2009-0122860 A | 12/2009 |
| KR | 10-2010-0085743 A | 7/2010 |
| TW | 200514163 | 4/2005 |
| TW | 200707582 | 2/2007 |
| WO | 02/077320 A1 | 10/2002 |
| WO | 03/066933 A | 8/2003 |
| WO | 2005/078784 A | 8/2005 |
| WO | 2006/014034 A1 | 2/2006 |
| WO | 2007/040856 A2 | 4/2007 |
| WO | 2007/140376 A | 12/2007 |
| WO | 2007/140377 A | 12/2007 |
| WO | 2007/140424 A | 12/2007 |
| WO | 2009/055340 A1 | 4/2009 |
| WO | 2010/080216 | 7/2010 |
| WO | 2012/145148 A2 | 10/2012 |
| WO | 2013-025336 | 2/2013 |

OTHER PUBLICATIONS

Aylett, B. J. et al., "Silicon—Nitrogen Compounds. Part V. Diphenylamino-derivatives of Silane," J. Chem. Soc. (A), Apr. 1969, pp. 636-638.

Aylett, B. J. et al., "Silicon—Nitrogen Compounds. Part VI. The Preparation and Properties of Disilazane," J. Chem. Soc. (A), Apr. 1969, pp. 639-642.

Aylett, B. J. et al., "The Preparation and Some Properties of Disilylamine-Correspondence," Inorganic Chemistry, Jan. 1966, p. 167.

Beach, "Infrared and Mass Spectroscopic Study of the Reaction of Silyl Iodide and Ammonia. Infrared Spectrum to Silylamine," Inorganic Chemistry, Sep. 1992, pp. 4174-4177, vol. 31 No. 20.

Bowen, C., et al., "New Processing Techniques: Sweeping of Quartz Wafers and A Practical Method for Processing Quartz Resonators Under Controlled Conditions," Proceedings of the 1992 IEEE Frequency Control Symposium, pp. 648-656.

Burg, Anton B. et al., "Silyl-Amino Boron Compounds," J. Amer. Chem. Soc., Jul. 1950, pp. 3103-3107, vol. 72.

Coltrin, M.E., et al., "Chemistry of AlGaN Particulate Formation," National Nuclear Security Administration, Physical, Chemical, & Nano Sciences Center, Research Briefs, 2005, pp. 42-43.

Davison, A et al., "The Raman Spectra of Manganese and Rhenium Carbonyl Hydrides and Some Related Species," Inorganic Chemistry, Apr. 1967, pp. 845-847, vol. 6 No. 4.

Dussarrat, C. et al., "Low Pressure Chemical Vapor Deposition of Silicon Nitride Using Mono- and Disilylamine," Chemical Vapor Deposition XVI and EUROCVD 14 vol. 2 Proceedings of the International Symposium, Part of the 203rd Electrochemical Society Meeting in Paris France, Apr. 27-May 2, 2003, 11 pages.

Franz, et al., "Conversion of silicon nitride into silicon dioxide through the influence of oxygen," Solid-State Electronics, Jun. 1971, pp. 449-505, vol. 14, Issue 6, Germany. Abstract Only.

Gulleri, G. et al., "Deposition Temperature Determination of HDPCVD Silicon Dioxide Films," 2005, Microelectronic Engineering, vol. 82, pp. 236-241.

International Search Report and Written Opinion of PCT/US2011/054635, mailed Jul. 9, 2012, 11 pages.

International Search Report and Written Opinion of PCT/US2011/054981, mailed May 9, 2012, 10 pages.

International Search Report and Written Opinion of PCT/US2011/054984, mailed May 11, 2012, 10 pages.

International Search Report and Written Opinion of PCT/US2011/066275, mailed Sep. 24, 2012, 9 pages.

International Search Report and Written Opinion of PCT/US2011/066281, mailed Jul. 19, 2012, 10 pages.

International Search Report and Written Opinion of PCT/US2011/066601, mailed Jul. 20, 2012, 10 pages.

International Search Report and Written Opinion of PCT/US2012/026786, mailed Jan. 2, 2013, 7 pages.

International Search Report and Written Opinion of PCT/US2012/031640 mailed Oct. 18, 2012, 10 pages.

International Search Report and Written Opinion of PCT/US2012/039629, mailed Dec. 26, 2012, 6 pages.

(56) References Cited

OTHER PUBLICATIONS

International Search Report and Written Opinion of PCT/US2012/059400, mailed Mar. 26, 2013, 11 pages.

International Search Report and Written Opinion of PCT/US2012/065086, mailed Mar. 25, 2013, 10 pages.

Kang, Hun, "A Study of the Nucleation and Formation of Multifunctional Nanostructures using GaN-Based Materials for Device Applications," Georgia Institute of Technology, Doctor of Philosophy in the School of Electrical & Computer Engineering Dissertation, Dec. 2006, 187 pages.

Lee, Eun Gu, et al., "Effects of Wet Oxidation on the Electrical Properties of sub-10 nm thick silicon nitride films", Thin Solid Films, Elsevier-Sequoia S.A. Lausanne, CH. vol. 205, No. 2, Dec. 1, 1991, pp. 246-251.

Loboda, M.J., et al., "Chemical influence of inert gas on the thin film stress in plasma-enhanced chemical vapor deposited a-SiN:H films". Journal of Materials Research, vol. 11, No. 2, Feb. 1996, pp. 391-398.

Lucovsky, G. et al., "Deposition of silicon dioxide and silicon nitride by remote plasma enhanced chemical vapor deposition," Journal of Vacuum Science & Technology, vol. 4, No. 3, May-Jun. (1986), pp. 681-688.

Norman, et al., "Reaction of Silylphosphine with Ammonia," Inorganic Chemistry, Jun. 1979, pp. 1594-1597, vol. 18 No. 6.

Search Report mailed Sep. 4, 2012, European Application No. 07811964, now patent No. 2022087, 8 pages.

Sujishi, Sei et al., "Effect of Replacement of Carbon by Silicon in Trimethylamine on the Stabilities of the Trimethylboron Addition Compounds. Estimation of the Resonance Energy for Silicon—Nitrogen Partial Double Bond," Amer. Chem. Soc., Sep. 20, 1954, pp. 4631-4636, vol. 76.

Tripp, et al., "The Anodic Oxidation of Silicon Nitride Films on Silicon," Journal of the Electrochemical Society, 1970, pp. 157-159, 117(2).

Tsu, D. V. et al., "Silicon Nitride and Silicon Diimide Grown by Remote Plasma Enhanced Chemical Vapor Deposition", Journal of Vacuum Science and Technology: Part A, AVS/AIP, Melville, NY, US, vol. 4, No. 3, Part 01, May 1, 1986, pp. 480-485.

Usenko, et al., "Silicon Nitride Surface Conversion into Oxide to Enable Hydrophilic Bonding," ECS Meeting Abstracts, 2010, 1 page, Abstract #1716, 218th ECS Meeting.

Ward, L. G. L. et al., "The Preparation and Properties of *Bis*-Disilanyl Sulphide and *Tris*-Disilanylamine," J. Inorg. Nucl. Chem., Dec. 1961, pp. 287-293, vol. 21, Pergamon Press Ltd., Northern Ireland.

Ward, Laird G. L., "Bromosilane, Iodosilane, and Trisilylamine," Inorganic Syntheses, 1968, pp. 159-170, vol. 11.

Zuckerman, J.J., "Inorganic Reactions and Methods," Formation of Bonds to N, P, As, Sb, Bi (Part 1), ISBN-0-89573-250-5, Jan. 1998, 5 pages, vol. 7, VCH Publishers, Inc., New York.

International Search Report and Written Opinion of PCT/US2012/053999, mailed Feb. 27, 2013, 12 pages.

Wang Li et al., "Properties of Hydrogenated Amorphous Silicon Caarbide Films Irradiated by Excimer Pulse Laser," 1998, Abstract Only.

Ying-Yu et al., "Preparation of SiC Thin Film Using Organosilicon by Remote Plasma CVD Method," 1999, Abstract Only.

\* cited by examiner

LOW-K DIELECTRIC GAPFILL BY FLOWABLE DEPOSITION

FIELD

Embodiments of the invention relate to flowably depositing low-k dielectric into substrate gaps.

BACKGROUND

The miniaturization of semiconductor circuit elements has reached a point where feature sizes of 28 nm, 22 nm, and even 14 nm are fabricated on a commercial scale. As the dimensions continue to get smaller, new challenges arise for process steps like filling a gap between circuit elements with a dielectric material that avoids electrical cross-talk. As the width between the elements continues to shrink, the gap between them often gets taller and narrower, making the gap difficult to fill without the dielectric material getting stuck to create voids or weak seams. Conventional chemical vapor deposition (CVD) techniques often experience an overgrowth of material at the top of the gap before it has been completely filled. This can create a void or seam in the gap where the depositing dielectric material has been prematurely cut off by the overgrowth; a problem sometimes referred to as breadloafing.

One solution to the breadloafing problem has been to use liquid precursors for the dielectric starting materials that more easily flow into the gaps. A technique currently in commercial use for doing this is called spin-on-glass (SOG). More recently, techniques have been developed that impart flowable characteristics to dielectric materials deposited by CVD. These techniques can deposit flowable precursors to fill a tall, narrow gap while reducing an incidence of creating voids or weak seams. While the new flowable CVD techniques represent a significant breakthrough in filling tall, narrow (i.e., high-aspect ratio) gaps with dielectric materials such as silicon oxide, there is still a need for techniques that can seamlessly fill such gaps with low-k dielectric materials. The present application addresses this need by describing flowable CVD techniques for forming silicon-and-carbon containing dielectric materials on a substrate.

SUMMARY

Methods are described for forming a flowable low-k dielectric layer on a patterned substrate. The film may be a silicon-carbon-oxygen (Si—C—O) layer in which the silicon and carbon constituents come from a silicon and carbon containing precursor while the oxygen may come from an oxygen-containing precursor activated in a remote plasma region. A similarly deposited silicon oxide layer may be deposited first to improve the gapfill capabilities. Alternatively, or in combination, the flow of a silicon-and-carbon-containing precursor may be reduced during deposition to change the properties from low-k to high strength roughly following the filling of features of the patterned substrate.

Embodiments of the invention include methods of filling a trench. The methods include transferring a patterned substrate comprising the trench into a substrate processing region of a substrate processing chamber. The methods include flowing an oxygen-containing precursor into a remote plasma region while igniting a remote plasma to form a radical-oxygen precursor. The methods include flowing a silicon-and-carbon-containing precursor into the substrate processing region without first passing the silicon-and-carbon-containing precursor through a plasma. The silicon-and-carbon-containing precursor has a Si—O:Si ratio of less than 3. The methods further include flowing the radical oxygen precursor into the substrate processing region. The methods further include combining the silicon-and-carbon-containing precursor and the radical oxygen precursor in the substrate processing region to form a low-k dielectric layer on the patterned substrate. A portion of the low-k dielectric layer deposits on the substrate and flows along the surface during formation of the low-k dielectric layer to fill the trench. A flow rate of the silicon-and-carbon-containing precursor is reduced during formation of the low-k dielectric layer. The methods further include solidifying the low-k dielectric layer within the trench.

Embodiments of the invention include methods of filling a trench. The methods include transferring a patterned substrate comprising the trench into a substrate processing region of a substrate processing chamber. The methods further include flowing an oxygen-containing precursor into a remote plasma region while igniting a remote plasma to form a radical-oxygen precursor. The methods further include flowing the radical oxygen precursor into the substrate processing region. The methods further include flowing a first silicon-and-carbon-containing precursor into the substrate processing region without first passing the first silicon-and-carbon-containing precursor through a plasma. The first silicon-and-carbon-containing precursor has a Si—O:Si ratio of less than 3. The methods further include flowing a second silicon-and-carbon-containing precursor into the substrate processing region without first passing the second silicon-and-carbon-containing precursor through a plasma. The second silicon-and-carbon-containing precursor has a Si—O:Si ratio of greater than 2. The methods further include combining the first silicon-and-carbon-containing precursor, the second silicon-and-carbon-containing precursor and the radical oxygen precursor in the substrate processing region to form a low-k dielectric layer on the patterned substrate. A portion of the low-k dielectric layer deposits on the substrate and flows along the surface during formation of the low-k dielectric layer to fill the trench. A partial pressure ratio of the first silicon-and-carbon-containing precursor to the second silicon-and-carbon-containing precursor within the substrate processing region is reduced in the course of forming the low-k dielectric layer. The methods further include solidifying the low-k dielectric layer within the trench.

Embodiments of the invention include methods of filling a trench. The methods include transferring a patterned substrate comprising the trench into a substrate processing region of a substrate processing chamber. The methods further include flowing an oxygen-containing precursor into a remote plasma region while igniting a remote plasma to form a radical-oxygen precursor. The methods further include flowing the radical oxygen precursor into the substrate processing region. The methods further include flowing a liner silicon-and-carbon-containing precursor into the substrate processing region without first passing the liner silicon-and-carbon-containing precursor through a plasma. The liner silicon-and-carbon-containing precursor has a Si—O:Si ratio of greater than 2. The methods further include combining the liner silicon-and-carbon-containing precursor with the radical oxygen precursor in the substrate processing region to form a liner silicon oxide layer on the patterned substrate. The methods further include flowing a bulk silicon-and-carbon-containing precursor into the substrate processing region without first passing the bulk silicon-and-carbon-containing precursor through a plasma. The bulk silicon-and-carbon-containing precursor has a Si—O:Si ratio of less than 3. The methods further include combining the bulk silicon-and-carbon-containing precursor with the radical oxygen precursor in the substrate processing region to form a low-k dielectric layer on the liner silicon oxide layer. A portion of the low-k dielectric layer deposits on the substrate and flows along the surface during formation of the low-k dielectric layer to fill the trench. The methods further include solidifying the low-k dielectric layer within the trench.

Additional embodiments and features are set forth in part in the description that follows, and in part will become apparent to those skilled in the art upon examination of the specification or may be learned by the practice of the invention. The features and advantages of the invention may be realized and attained by means of the instrumentalities, combinations, and methods described in the specification.

DESCRIPTION OF THE DRAWINGS

A further understanding of the nature and advantages of the present invention may be realized by reference to the remaining portions of the specification and the drawings.

DETAILED DESCRIPTION

Methods are described for forming a flowable low-k dielectric layer on a patterned substrate. The film may be a silicon-carbon-oxygen (Si—C—O) layer in which the silicon and carbon constituents come from a silicon and carbon containing precursor while the oxygen may come from an oxygen-containing precursor activated in a remote plasma region. A similarly deposited silicon oxide layer may be deposited first to improve the gapfill capabilities. Alternatively, or in combination, the flow of a silicon-and-carbon-containing precursor may be reduced during deposition to change the properties from low-k to high strength roughly following the filling of features of the patterned substrate.

Figure 1:
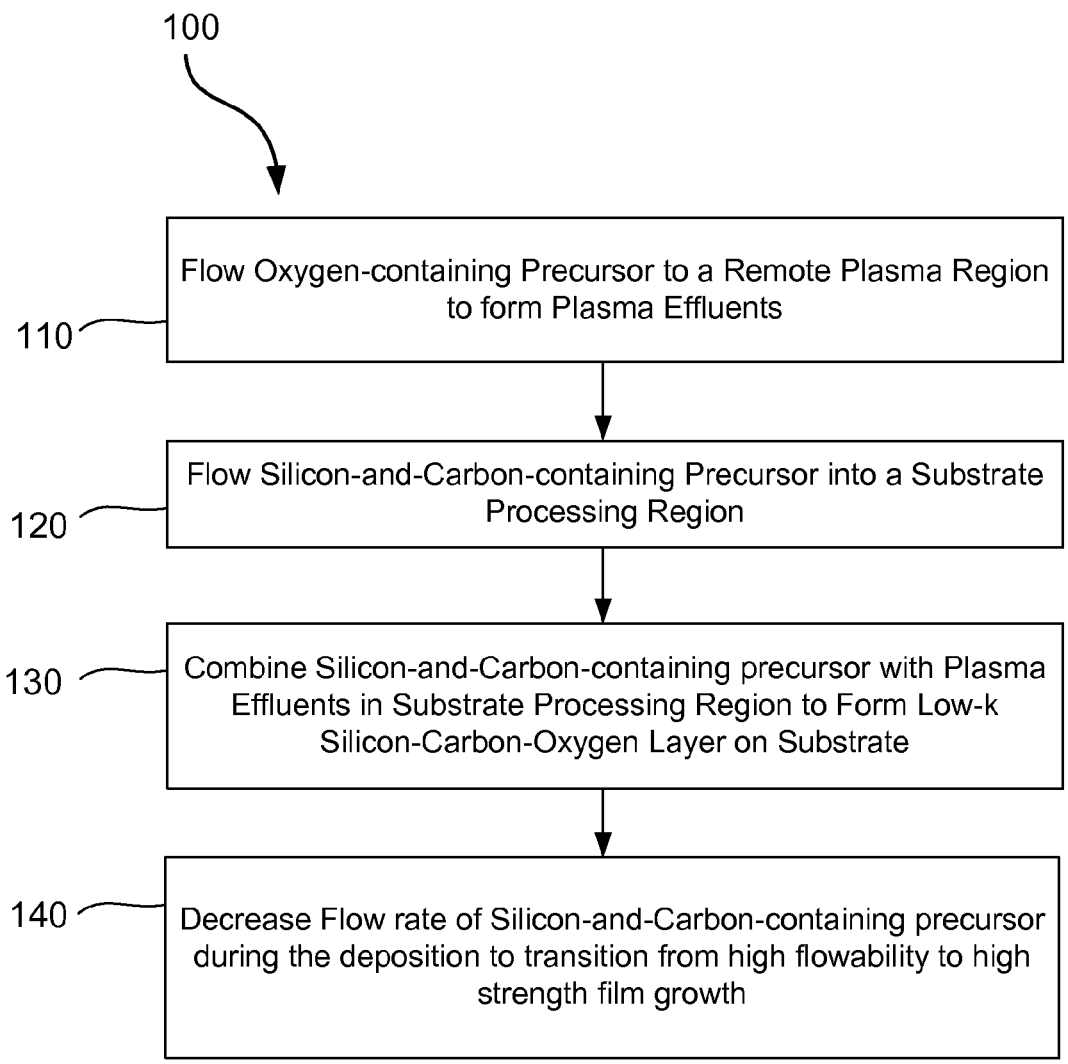
FIG. 1 is a flowchart illustrating selected steps in a method of forming a gapfill low-k dielectric film on a substrate according to embodiments.

In order to better understand and appreciate the invention, reference is now made to FIG. 1 which is a flowchart illustrating selected steps in a method 100 of forming a gapfill low-k dielectric film on a substrate according to embodiments. An oxygen-containing precursor is flowed into a remote plasma in a remote plasma region to form plasma effluents in operation 110. The oxygen-containing precursor is energized in the remote plasma formed in a remote plasma system (RPS) positioned outside the substrate processing chamber and/or a remote plasma region within the substrate processing chamber but partitioned from the substrate processing region by a restriction such as a showerhead. The oxygen-containing precursor may be excited in a remote plasma. In the remote plasma (regardless of position), the oxygen-containing precursor may be dissociated, radicalized, and/or otherwise transformed into the radical-oxygen precursor within the plasma effluents. For example, when the source of oxygen-containing precursor is $O_2$, radical-oxygen precursor may include one or more of .O, .$O_2$, $O_3$, and oxygen radicals. The radical-oxygen precursor is then flowed through a restriction, such as a showerhead, into a substrate processing region. Independently, a silicon-and-carbon-containing precursor is flowed into the substrate processing region in operation 120. The radical-oxygen precursor may mix for the first time with the silicon-and-carbon-containing precursor in the substrate processing region (operation 130). The silicon-and-carbon-containing precursor has not flowed through any plasma prior to entering the substrate processing region according to embodiments.

Exemplary sources for the oxygen-containing precursor may include ozone ($O_3$), molecular oxygen ($O_2$), atomic oxygen (O), NO, $N_2O$, and $NO_2$, among others. The oxygen-containing precursor may be accompanied by one or more additional gases such a hydrogen ($H_2$), nitrogen ($N_2$), helium, neon, argon according to embodiments. The plasma effluents comprise a radical-oxygen precursor which is defined as any oxygen-containing components having at least one unpaired electron. The radical-oxygen precursor may contribute some or all of the oxygen constituent in the deposited low-k film which may be a silicon-carbon-oxygen film in embodiments. According to some embodiments, the oxygen-precursor may be nitrogen-free to promote the formation of relatively low-k dielectric gapfill. Similarly, the remote plasma region may be devoid of nitrogen (e.g. no nitrogen ($N_2$)) in order to promote the formation of the low-k dielectric according to embodiments. For example, the oxygen-containing precursor may include ozone, molecular oxygen and atomic oxygen in embodiments. In this case, the radical-oxygen (a component of the plasma effluents) will also be nitrogen-free. The silicon-carbon-oxygen film may be nitrogen-free in embodiments. The oxygen-precursor may also contain carbon that provides at least some of the carbon constituent in the deposited silicon-carbon-oxygen layer.

Once in the substrate processing region, the radical oxygen precursor and the silicon-and-carbon-containing precursor may react, in operation 130, to form a flowable low-k dielectric or silicon-carbon-oxygen layer on the substrate. The flow rate of the silicon-and-carbon-containing precursor may be reduced during the formation of the flowable low-k dielectric film in operation 140. Reducing the flow rate (or more generally the partial pressure or partial pressure ratio of the silicon-and-carbon-containing precursor) has been found to beneficially alter the properties of the low-k dielectric film. Reducing the partial pressure of the silicon-and-carbon-containing precursor may be accomplished by reducing the flow rate and/or increasing the pumping speed used to exhaust unreacted or process effluent gases from the substrate processing region. Early in the film formation, the low-k film is filling narrow features on the patterned substrate and the completed device benefits if the film is flowable and has a low-k. Later in the film formation, the low-k film has already filled the narrow features and the subsequent processing steps (e.g. CMP) benefit if the structural integrity of the film is high. Reducing the flow rate of the silicon-and-carbon-containing precursor during low-k film formation has been found to reduce flowability, increase dielectric constant and increase the strength or resilience of the low-k dielectric film. Generally speaking, the partial pressure of the silicon-and-carbon-containing precursor may be reduced during formation of the low-k dielectric film, in embodiments, to create the heterogeneous low-k film just described.

The partial pressure of the silicon-and-carbon-containing precursor (or the flow rate) may be reduced by more than 25%, more than 30% or more than 40% during formation of the low-k dielectric film according to embodiments. The partial pressure or flow rate may be reduced in a single discrete step, in embodiments, or the partial pressure or flow rate may be reduced in multiple discrete steps. The partial pressure or flow rate may be decreased smoothly during a portion of the low-k dielectric film formation process 100 according to embodiments. The percentages governing the partial pressure or flow rate reduction provided above compare the first partial pressure/flow rate with the last partial pressure/flow rate before the silicon-and-carbon-containing precursor flow is stopped in embodiments. According to embodiments, a second partial pressure of the silicon-and-carbon-containing precursor measured in the substrate processing region at the end of the formation of the low-k dielectric layer may be less than a first partial pressure measured at the beginning of the formation of the low-k dielectric layer (by any of the above percentages).

The silicon-and-carbon-containing precursor may further contain oxygen. The silicon-and-carbon-containing precursor may possess a Si—O to Si ratio of 1 or less than 3 according to embodiments. These ratios correlate with the production of flowable low-k dielectric films using the methods described herein. The Si—O to Si ratio is calculated by counting the number of Si—O bonds in the precursor and dividing by the number of silicon atoms in the precursor. For example, the silicon-and-carbon-containing precursor may be octamethylcyclotetrasiloxane or tetramethylcyclotetrasiloxane, which each have a Si—O:Si ratio of 1, and have been found to correlate with an increased degree of flowability and a decreased dielectric constant. In embodiments, the silicon-and-carbon-containing precursor may be nitrogen-free to enable the production of nitrogen-free low-k dielectric.

The flowability of the initially-deposited silicon-carbon-oxygen layer may be due to a variety of properties which result from mixing an radical oxygen precursor with the silicon-and-carbon-containing precursor. These properties may include a significant carbon content and/or a significant hydrogen content in the initially-deposited silicon-carbon-oxygen layer. The flowability does not rely on a high substrate temperature, therefore, the initially-flowable silicon-carbon-and-oxygen-containing layer may fill gaps even on relatively low temperature substrates. The temperature of the substrate during method 100 may be less than 150° C., less than 120° C., less than 100° C. or between 65° C. and 95° C. in embodiments. The pressure in the substrate processing region may be about 0.1 Torr to about 10 Torr (e.g., about 0.5 to about 6 Torr, etc.) during the deposition of the low-k dielectric or silicon-carbon-oxygen film of method 100. The initially flowable silicon-carbon-oxygen layer may be deposited on exposed planar surfaces a well as into gaps. The thickness of the low-k dielectric layer (the silicon-carbon-oxygen layer) may be greater than 50 Å, greater than 100 Å, greater than 150 Å, greater than 250 Å or greater than 350 Å according to embodiments. The silicon-carbon-oxygen layer may consist of silicon, carbon and oxygen or may consist of silicon, carbon, oxygen and hydrogen, in embodiments. The silicon-carbon-oxygen layer is nitrogen-free in embodiments. All film properties and process parameters given for this example also apply to subsequent examples according to embodiments.

When the flowable silicon-carbon-oxygen layer reaches a desired thickness, the process effluents may be removed from the substrate-processing region and/or the flow of radical-oxygen into the substrate processing region may be stopped. These process effluents may include any unreacted oxygen-containing and silicon-and-carbon-containing precursors, diluent and/or carrier gases, and reaction products that did not deposit on the substrate. The process effluents may be removed by evacuating the substrate processing region and/or displacing the effluents with non-deposition gases in the substrate processing region. The carbon content (on an atomic percentage basis) of the silicon-carbon-oxygen layer may be greater than 5% or greater than 8% in embodiments. In a preferred embodiment, the atomic percentage of carbon content is greater than 10% which further increases the flowability of initially-flowable silicon-carbon-oxygen films. The oxygen content (on an atomic percentage basis) of the silicon-carbon-oxygen layer may be greater than 5% greater than 8% or greater than 10% in embodiments.

The oxygen containing precursor may be flowed into the remote plasma region at a flow rate between 10 sccm and 4000 sccm, between 200 sccm and 3000 sccm, or between 500 sccm and 2000 sccm in embodiments. The silicon-and-carbon-containing precursor may be supplied in the source of a gas or a liquid. The silicon-and-carbon-containing precursor may be flowed directly into the substrate processing region at a flow rate between 10 sccm and 4000 sccm, between 200 sccm and 3000 sccm, or between 1200 sccm and 2000 sccm according to embodiments. The silicon-and-carbon-containing precursor may be flowed directly into the substrate processing region (with the assistance of a carrier gas) at a flow rate between 0.1 milligrams per minute and 2000 milligrams per minute, between 0.3 milligrams per minute and 1000 milligrams per minute or between 0.5 milligrams per minute and 100 milligrams per minute in embodiments.

Figure 2:
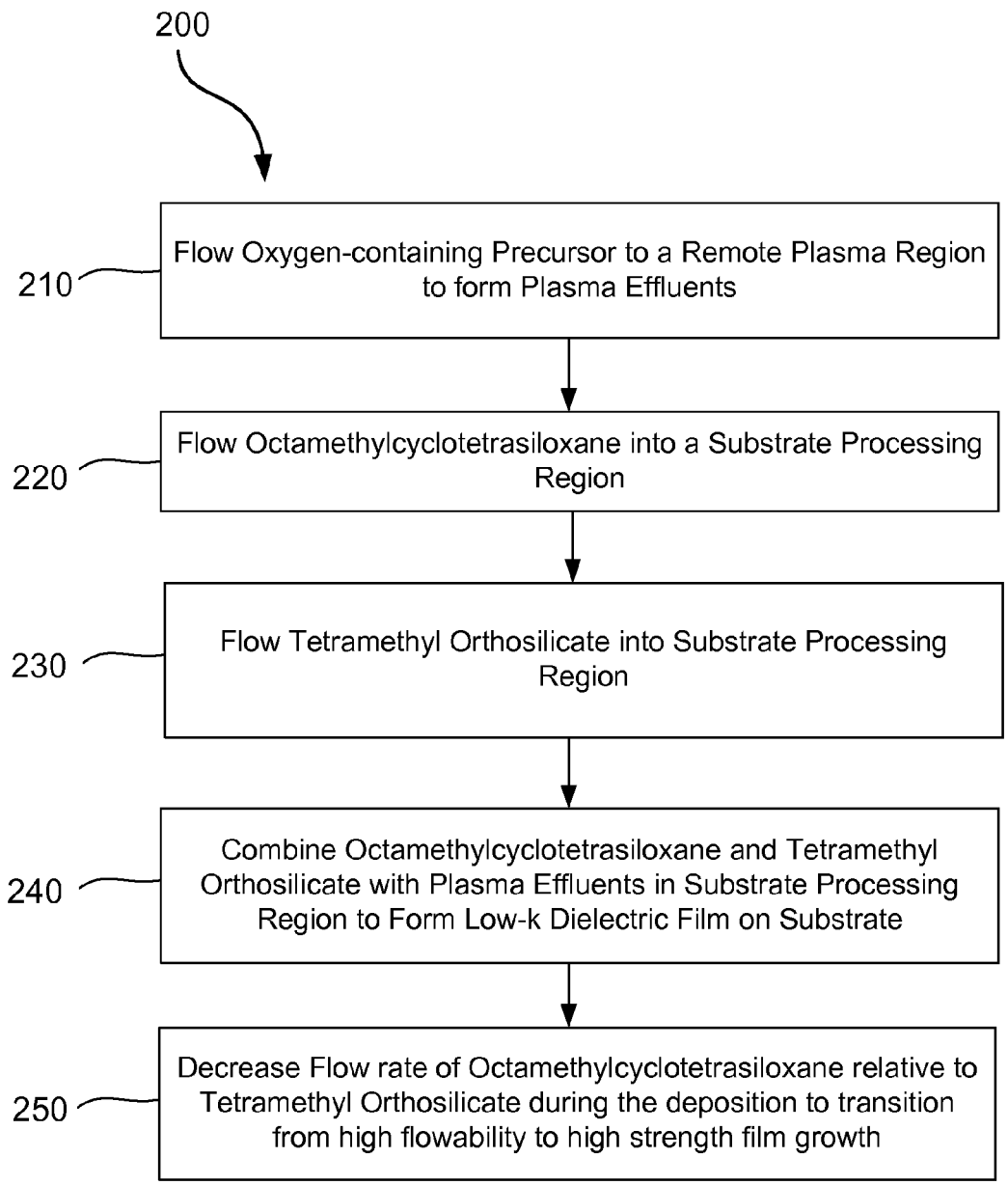
FIG. 2 is a flowchart illustrating selected steps in a method of forming a gapfill low-k dielectric film on a substrate according to embodiments.

Reference will now be made to FIG. 2 which is a flowchart illustrating selected steps in a method 200 of forming a gapfill low-k dielectric film on a substrate according to embodiments. Flow rates, pressures, temperatures, thicknesses may have the same quantities described for the previous example and may not be repeated here. An oxygen-containing precursor is flowed into a remote plasma in a remote plasma region to form plasma effluents in operation 210. The oxygen-containing precursor may be energized in a plasma formed in a remote plasma system (RPS) or a remote plasma region inside the substrate processing chamber. A remote plasma plasma region may be partitioned from the substrate processing region. The substrate processing region may be "plasma free" region during the deposition process or may possess a low electron temperature as measured with a Langmuir probe.

Exemplary sources for the oxygen-containing precursor may include ozone ($O_3$), molecular oxygen ($O_2$), atomic oxygen (O), NO, $N_2O$, and $NO_2$, among others. The oxygen-containing precursor may be nitrogen-free to promote the formation of relatively low-k dielectric gapfill. The radical-oxygen precursor is then flowed through a restriction, such as a showerhead, into a substrate processing region. Independently, a first silicon-and-carbon-containing precursor (e.g. octamethylcyclotetrasiloxane) is flowed into the substrate processing region in operation 220. A second silicon-and-carbon-containing precursor (e.g. tetramethyl orthosilicate) is also flowed into the substrate processing region in operation 230. The combination of the first silicon-and-carbon-containing precursor and the second silicon-and-carbon-containing precursor will be referred to as the silicon-and-carbon-containing precursor for all embodiments described herein in which two such precursors are present. Generalizations of properties for the first and second silicon-and-carbon-containing precursors will be described shortly. The radical-oxygen precursor may mix for the first time with the silicon-and-carbon-containing precursor in the substrate processing region (operation 240). The silicon-and-carbon-containing precursor (the first and the second components) has not flowed through any plasma prior to entering the substrate processing region according to embodiments. The first silicon-and-carbon-containing precursor and the second silicon-and-carbon-containing precursor may flow through separate inlets or may be combined prior to entering the substrate processing region. The remote plasma region and the substrate processing region may each be devoid of nitrogen to allow the formation of the low-k dielectric according to embodiments. For example, the oxygen-containing precursor may include ozone, molecular oxygen and atomic oxygen in embodiments. The radical-oxygen and/or the plasma effluents may also be nitrogen-free. The low-k dielectric film and/or the silicon-carbon-oxygen film may be nitrogen-free in embodiments. The oxygen-precursor may also contain carbon that provides at least some of the carbon constituent in the deposited silicon-carbon-oxygen layer.

Once in the substrate processing region, the radical oxygen precursor and the silicon-and-carbon-containing precursor may react to form a flowable low-k dielectric or silicon-carbon-oxygen layer on the substrate. The ratio of the flow rates of the first silicon-and-carbon-containing precursor to the second silicon-and-carbon-containing precursor may be reduced during the formation of the flowable low-k dielectric film in operation 250. Reducing the ratio of the flow rates (or more generally the ratio of the partial pressures of the first silicon-and-carbon-containing precursor to the second silicon-and-carbon-containing precursor) has been found to beneficially alter the properties of the low-k dielectric film. Reducing the ratio of the first silicon-and-carbon-containing precursor to the second silicon-and-carbon-containing precursor may be accomplished by reducing the flow rate of the first silicon-and-carbon-containing precursor and/or increasing the flow rate of the second silicon-and-carbon-containing precursor. As with the previous example, the change in flow rates transitions the low-k film from flowable during the filling of narrow features to high structural integrity, e.g., after the features are filled and deposition has moved into the overburden phase. Reducing the flow rate ratio of the first silicon-and-carbon-containing precursor compared to the second silicon-and-carbon-containing precursor during low-k film formation has been found to reduce flowability, increase dielectric constant and increase the strength or resilience of the low-k dielectric film. Generally speaking, the partial pressure ratio of the first silicon-and-carbon-containing precursor compared to the second silicon-and-carbon-containing precursor may be reduced during formation of the low-k dielectric film, in embodiments, to create the heterogeneous low-k film just described. The second silicon-and-carbon-containing precursor is thought to increase cross-linking within the dielectric film and thus to increase structural integrity while reducing flowability and increasing dielectric constant.

The partial pressure ratio of the first silicon-and-carbon-containing precursor to the second silicon-and-carbon-containing precursor (or the flow rate ratio) may be reduced by more than 25%, more than 30% or more than 40% during formation of the low-k dielectric film according to embodiments. The partial pressure ratio or flow rate ratio may be reduced in a single discrete step, in embodiments, or the partial pressure ratio or flow rate ratio may be reduced in multiple discrete steps (e.g. ten discrete steps). The partial pressure ratio or flow rate ratio may be decreased smoothly during a portion of the low-k dielectric film formation process 100 according to embodiments. The percentages governing the partial pressure ratio or flow rate ratio reduction provided above compare the first partial pressure ratio/flow rate ratio with the last partial pressure ratio/flow rate ratio before the silicon-and-carbon-containing precursor flow is stopped in embodiments. According to embodiments, a second partial pressure ratio of the first silicon-and-carbon-containing precursor to the second silicon-and-carbon-containing precursor measured in the substrate processing region at the end of the formation of the low-k dielectric layer may be less than a first partial pressure ratio measured in the substrate processing region at the beginning of the formation of the low-k dielectric layer (by any of the above percentages).

The first silicon-and-carbon-containing precursor and the second may further contain oxygen. The first silicon-and-carbon-containing precursor may possess a Si—O to Si ratio of 1 or less than 3 according to embodiments. These ratios correlate with the production of flowable low-k dielectric films using the methods described herein. The Si—O to Si ratio is calculated by counting the number of Si—O bonds in the precursor and dividing by the number of silicon atoms in the precursor. For example, the silicon-and-carbon-containing precursor may be octamethylcyclotetrasiloxane or tetramethylcyclotetrasiloxane, which each have a Si—O:Si ratio of 1. In embodiments, the silicon-and-carbon-containing precursor may be nitrogen-free to enable the production of nitrogen-free low-k dielectric. The second silicon-and-carbon-containing precursor may possess a Si—O to Si ratio of 4 or greater than 2 in embodiments. These ratios correlate with production of a less flowable, less low-k but greater strength film. Stronger films may have greater bulk modulus or a greater shear modulus according to embodiments compared to films made with a higher concentration of Si—O:Si=1 or Si—O:Si=2 precursors. The second silicon-and-carbon-containing precursor may be tetramethyl orthosilicate, which has a Si—O:Si ratio of 4.

The flowability of the initially-deposited low-k dielectric layer may be due to the factors presented earlier during the discussion associated with FIG. 1. The temperatures of the substrate and pressures in the substrate processing region, during the deposition of the low-k dielectric film, may again be as recited previously. Also as before, the thickness of the low-k dielectric layer may be greater than 50 Å, greater than 100 Å, greater than 150 Å, greater than 250 Å or greater than 350 Å according to embodiments. The silicon-carbon-oxygen layer may again consist of silicon, carbon and oxygen or may consist of silicon, carbon, oxygen and hydrogen, in embodiments. The silicon-carbon-oxygen layer is nitrogen-free in embodiments.

The deposition process 200 may be terminated by removing precursors and plasma effluents from the substrate processing region as before. The carbon content (on an atomic percentage basis) of the silicon-carbon-oxygen layer may be greater than 5% or greater than 8% in embodiments. In a preferred embodiment, the atomic percentage of carbon content is greater than 10% which further increases the flowability of initially-flowable silicon-carbon-oxygen films. The oxygen content (on an atomic percentage basis) of the silicon-carbon-oxygen layer may be greater than 5% greater than 8% or greater than 10% in embodiments.

The oxygen containing precursor may be flowed into the remote plasma region at a flow rate between 10 sccm and 4000 sccm, between 200 sccm and 3000 sccm, or between 500 sccm and 2000 sccm in embodiments. The first silicon-and-carbon-containing precursor and/or the second silicon-and-carbon-containing precursor may be supplied in the source of a gas or a liquid. The first silicon-and-carbon-containing precursor may be flowed directly into the substrate processing region at a flow rate between 10 sccm and 4000 sccm, between 200 sccm and 3000 sccm, or between 1200 sccm and 2000 sccm in embodiments. The second silicon-and-carbon-containing precursor may be flowed directly into the substrate processing region at a flow rate between 10 sccm and 2000 sccm, between 200 sccm and 1500 sccm, or between 600 sccm and 1000 sccm in embodiments. Alternatively, the first or the second silicon-and-carbon-containing precursor may be flowed directly into the substrate processing region (with the assistance of a carrier gas) at a flow rate between 0.1 milligrams per minute and 2000 milligrams per minute, between 0.3 milligrams per minute and 1000 milligrams per minute or between 0.5 milligrams per minute and 100 milligrams per minute in embodiments.

Figure 3:
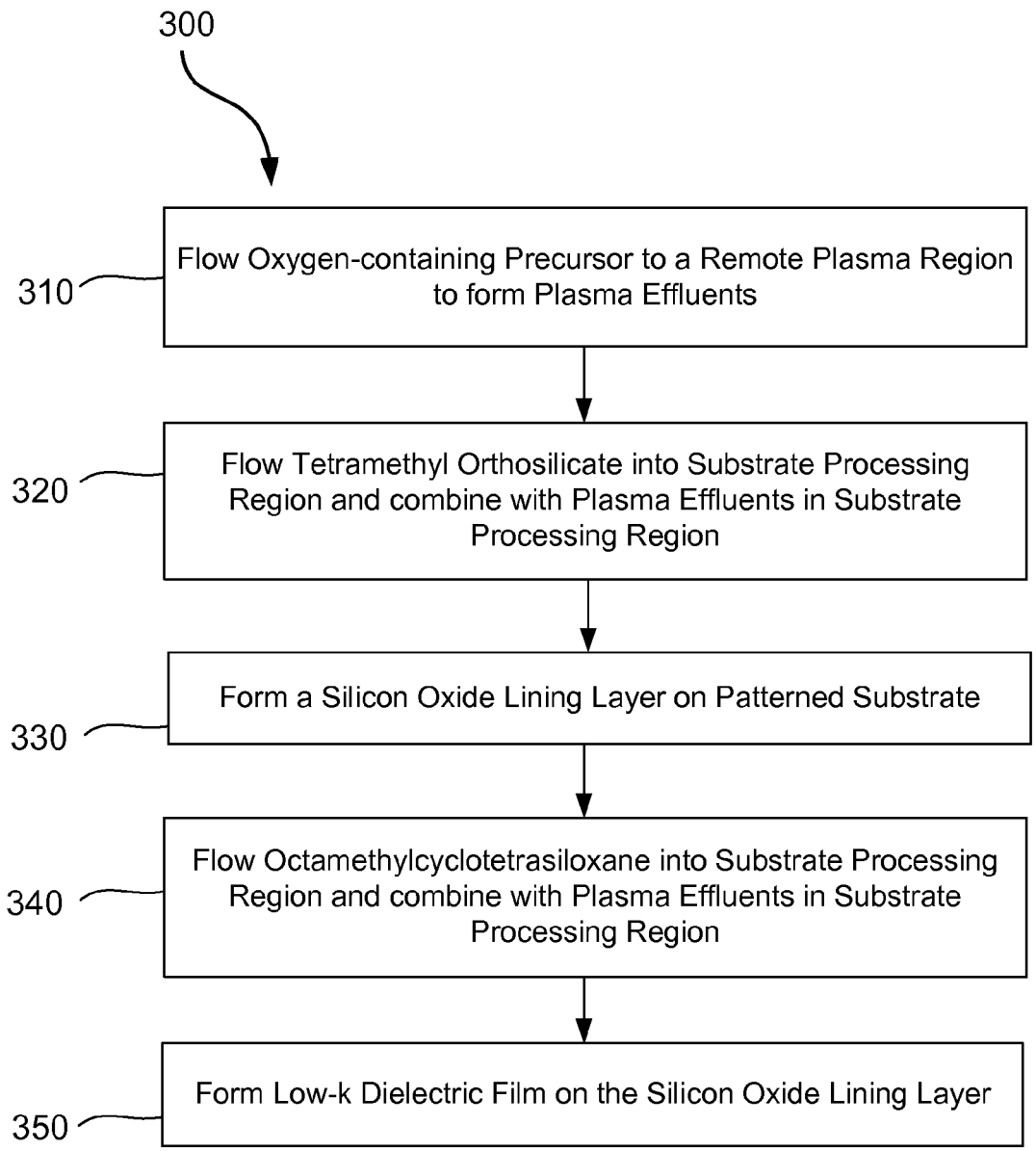
FIG. 3 is a flowchart illustrating selected steps in a method of forming a gapfill low-k dielectric film on a substrate according to embodiments.

Reference will now be made to FIG. 3 which is a flowchart illustrating selected steps in a method 300 of forming a gapfill low-k dielectric film on a substrate according to embodiments. This example involves the inclusion of a liner layer deposited using a similar deposition method to the bulk low-k dielectric films described in previous examples. Inclusion of the liner layer of this example may be combined with all the bulk low-k dielectric layers described herein and thus, the process parameters of the bulk low-k dielectric films described previously will not be repeated as this example is described. An oxygen-containing precursor is flowed into a remote plasma in a remote plasma region to form plasma effluents in operation 310. The oxygen-containing precursor is excited in a remote plasma formed in a remote plasma system (RPS) or a remote plasma region inside the substrate processing chamber. The substrate processing region may be "plasma free" region during the deposition process or may possess a low electron temperature as measured with a Langmuir probe.

The oxygen-containing precursor may be nitrogen-free to promote the formation of a relatively low-k dielectric liner. The radical-oxygen precursor is then flowed through a restriction, such as a showerhead, into a substrate processing region. Independently, a liner silicon-and-carbon-containing precursor (e.g. tetramethyl orthosilicate) is flowed into the substrate processing region in operation 320. The liner silicon-and-carbon-containing precursor may have a Si—O:Si ratio of 4 or greater than 2 according to embodiments. The radical-oxygen precursor may mix for the first time with the silicon-and-carbon-containing precursor in the substrate processing region. The liner silicon-and-carbon-containing precursor has not flowed through any plasma prior to entering the substrate processing region according to embodiments. For example, the oxygen-containing precursor may include ozone, molecular oxygen and atomic oxygen in embodiments. The radical-oxygen and/or the plasma effluents may also be nitrogen-free.

Once in the substrate processing region, the radical oxygen precursor and the silicon-and-carbon-containing precursor may react to form a liner silicon oxide layer on the substrate in operation 330. The liner silicon oxide may be nitrogen-free in embodiments. The remote plasma region and the substrate processing region may each be devoid of nitrogen to allow the formation of the liner silicon oxide according to embodiments. The thickness of the liner silicon oxide may be between 5 Å and 120 Å, between 10 Å and 100 Å or between 15 Å and 70 Å according to embodiments. The carbon content (on an atomic percentage basis) of the liner silicon oxide layer may be less than 8% or less than 5% or less than 3% in embodiments. The temperature of the substrate during the deposition of the liner silicon oxide layer in method 300 may be less than 150° C., less than 120° C., less than 100° C. or between 65° C. and 95° C. in embodiments.

The growth of the liner silicon oxide is stopped by any of the methods for stopping film growth described previously herein. The flow of the plasma effluents into the substrate processing is either continued or restarted after a pause and then a bulk low-k silicon-and-carbon-containing precursor is flowed directly into the substrate processing region without prior plasma excitation in operation 340. For example, the bulk silicon-and-carbon-containing precursor may have a Si—O:Si ratio of 1 or less than 3 according to embodiments. The bulk low-k silicon-and-carbon-containing precursor may be octamethylcyclotetrasiloxane or tetramethylcyclotetrasiloxane and a bulk low-k dielectric film is formed on the liner silicon oxide layer in operation 350. The bulk low-k dielectric film is flowably deposited using the methods presented in FIGS. 1-2 and elsewhere in the specification according to embodiments. However, the liner process parameters have not been previously presented and are provided below.

The oxygen containing precursor may be flowed into the remote plasma region during deposition of the liner silicon oxide layer at a flow rate between 5 sccm and 2000 sccm, between 200 sccm and 1500 sccm, or between 300 sccm and 1000 sccm in embodiments. The liner silicon-and-carbon-containing precursor may be supplied in the source of a gas or a liquid. The liner silicon-and-carbon-containing precursor may be flowed directly into the substrate processing region at a flow rate between 3 sccm and 1500 sccm, between 10 sccm and 1000 sccm, or between 100 sccm and 700 sccm in embodiments. The liner silicon-and-carbon-containing precursor may be flowed directly into the substrate processing region (with the assistance of a carrier gas) at a flow rate between 0.1 milligrams per minute and 2000 milligrams per minute, between 0.3 milligrams per minute and 1000 milligrams per minute or between 0.5 milligrams per minute and 100 milligrams per minute in embodiments. The pressure in the substrate processing region may be about 0.1 Torr to about 6 Torr (e.g., about 0.2 to about 3 Torr, etc.) during the deposition of the liner silicon oxide layer of method 300. The pressure in the substrate processing region during deposition of the liner silicon oxide layer may be less than or about half of the pressure in the substrate processing region during deposition of the bulk flowable low-k dielectric layer.

For all the examples presented herein, the flowably deposited low-k dielectric layer is solidified after the formation of the film. The solidification may involve curing, annealing and/or simply waiting for solidification to occur. After solidification, the low-k dielectric layer may have a dielectric constant of between 2.2 and 3.0, between 2.4 and 2.8 or between 2.5 and 2.7 according to embodiments. In embodiments which include a liner low-k dielectric film, both the liner low-k dielectric film and the bulk low-k dielectric film are included as gapfill and the contributions of both are included for determining the dielectric constant.

The gaps and trenches filled using the techniques described herein may have a height and width that define an aspect ratio (AR) of the height to the width (i.e., H/W) that is significantly greater than 1:1 (e.g., 5:1 or more, 6:1 or more, 7:1 or more, 8:1 or more, 9:1 or more, 10:1 or more, 11:1 or more, 12:1 or more, etc.). In many instances the high AR is due to small gap widths below 32 nm, below 28 nm, below 22 nm or below 16 nm according to embodiments.

Any or all of the deposition methods described herein may have a low electron temperature in the substrate processing region during the deposition to increase flowability and/or maintain a low dielectric constant according to embodiments. Techniques may therefore be used to reduce the electron temperature using an ion suppressor and/or a showerhead. The plasma effluents including the radical-oxygen precursor flow through the showerhead and/or the ion suppressor from the remote plasma region to the substrate processing region. In embodiments, an ion suppressor (which may be the showerhead) may be used to provide radical and/or neutral species for deposition. The ion suppressor may also be referred to as an ion suppression element. In embodiments, for example, the ion suppressor is used to filter plasma effluents (including radical-oxygen) en route from the remote plasma region to the substrate processing region. The ion suppressor may be used to provide a reactive gas having a higher concentration of radicals than ions. Plasma effluents pass through the ion suppressor disposed between the remote plasma region and the substrate processing region. The ion suppressor functions to dramatically reduce or substantially eliminate ionic species traveling from the plasma generation region to the substrate. The ion suppressors described herein are simply one way to achieve a low electron temperature in the substrate processing region during the low-k dielectric deposition and/or the silicon oxide liner deposition described above.

The electron temperature may be measured using a Langmuir probe in the substrate processing region during excitation of a plasma in the remote plasma. In embodiments, the electron temperature may be less than 0.5 eV, less than 0.45 eV, less than 0.4 eV, or less than 0.35 eV. These extremely low values for the electron temperature are enabled by the presence of the showerhead and/or the ion suppressor. Uncharged neutral and radical species may pass through the the openings in the showerhead/ion suppressor to react at the substrate. Such a process using radicals and other neutral species can reduce plasma damage compared to conventional deposition processes that include sputtering and bombardment.

Introducing alternative nomenclature, the substrate processing region may be described herein as "plasma-free" during the deposition processes described herein. "Plasma-free" does not necessarily mean the region is devoid of plasma. Ionized species and free electrons created within the plasma region may travel through pores (apertures) in the partition (showerhead) at exceedingly small concentrations. The borders of the plasma in the chamber plasma region are hard to define and may encroach upon the substrate processing region through the apertures in the showerhead. Furthermore, a low intensity plasma may be created in the substrate processing region without eliminating desirable features of the deposition processes described herein. All causes for a plasma having much lower intensity ion density than the chamber plasma region during the creation of the excited plasma effluents do not deviate from the scope of "plasma-free" as used herein.

Addition process parameters are introduced in the course of describing an exemplary processing system in the next section.

Exemplary Substrate Processing Systems and Chambers

Figure 4:
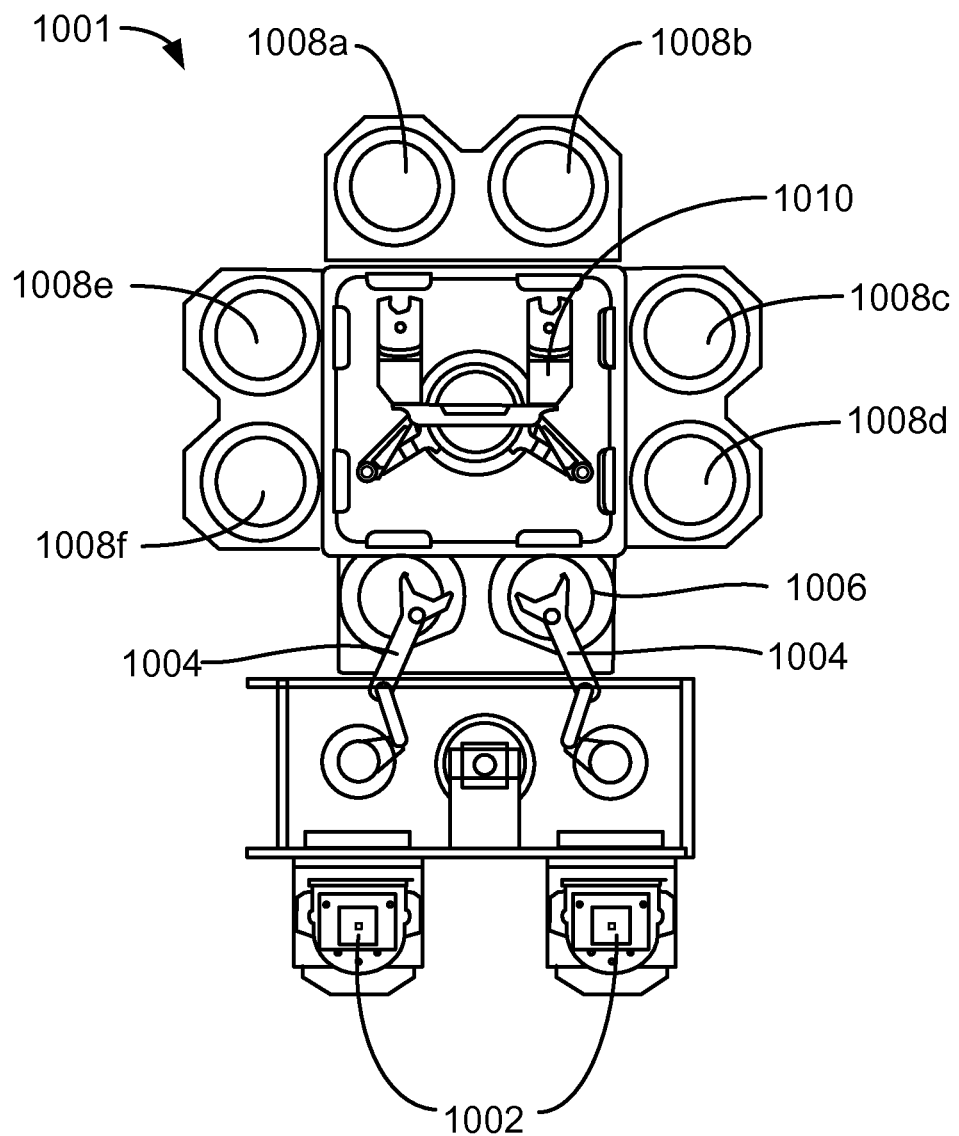
FIG. 4 shows a substrate processing system according to embodiments of the invention.

Embodiments of substrate processing chambers may be incorporated into a substrate processing system for producing integrated circuit chips. FIG. 4 shows exemplary processing system 1001 for deposition, baking and curing chambers according to embodiments. In the figure, a pair of FOUPs (front opening unified pods) 1002 supply substrate substrates (e.g., 300 mm diameter wafers) that are received by robotic arms 1004 and placed into a low pressure holding area 1006 before being placed into one of the substrate processing chambers 1008*a-f*. A second robotic arm 1010 may be used to transport the substrate wafers from the holding area 1006 to substrate processing chambers 1008*a-f* and back.

Substrate processing chambers 1008*a-f* may include one or more system components for depositing, annealing, curing and/or etching a flowable dielectric film on the substrate wafer. In one configuration, two pairs of the processing chamber (e.g., 1008*c-d* and 1008*e-f*) may be used to deposit the flowable dielectric material on the substrate, and the third pair of processing chambers (e.g., 1008*a-b*) may be used to anneal the deposited dielectric. In another configuration, the same two pairs of processing chambers (e.g., 1008*c-d* and 1008*e-f*) may be configured to both deposit and anneal a flowable dielectric film on the substrate, while the third pair of chambers (e.g., 1008*a-b*) may be used for UV or E-beam curing of the deposited film. In still another configuration, all three pairs of chambers (e.g., 1008*a-f*) may be configured to deposit and cure a flowable dielectric film on the substrate. In yet another configuration, two pairs of processing chambers (e.g., 1008*c-d* and 1008*e-f*) may be used for both deposition and UV or E-beam curing of the flowable dielectric, while a third pair of substrate processing chambers (e.g. 1008*a-b*) may be used for annealing the dielectric film. Any one or more of the processes described may be carried out on chamber(s) separated from substrate processing system 1001 in embodiments.

Figure 5A:
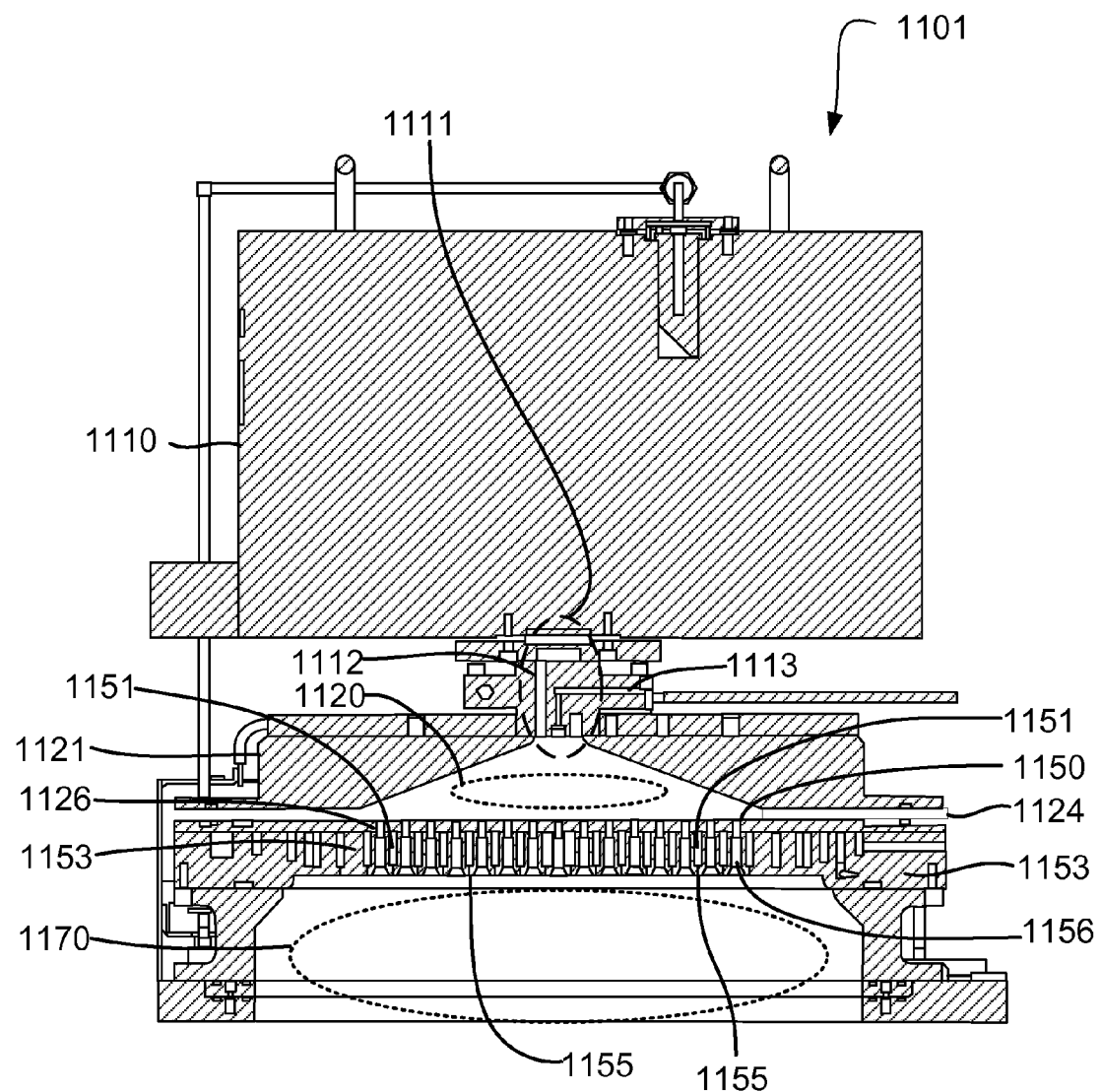
FIG. 5A shows a substrate processing chamber according to embodiments of the invention.

FIG. 5A is a substrate processing chamber 1101 according to embodiments. A remote plasma system (RPS) 1110 may process a gas which then travels through a gas inlet assembly 1111. Two distinct gas supply channels are visible within the gas inlet assembly 1111. A first channel 1112 carries a gas that passes through the remote plasma system (RPS) 1110, while a second channel 1113 bypasses the RPS 1110. The first channel 1112 may be used for the process gas and the second channel 1113 may be used for a treatment gas in embodiments. The lid (or conductive top portion) 1121 and a perforated partition 1153 are shown with an insulating ring 1124 in between, which allows an AC potential to be applied to the lid 1121 relative to perforated partition 1153. The process gas travels through first channel 1112 into chamber plasma region 1120 and may be excited by a plasma in chamber plasma region 1120 alone or in combination with RPS 1110. The combination of chamber plasma region 1120 and/or RPS 1110 may be referred to as a remote plasma system herein. The perforated partition (also referred to as a showerhead) 1153 separates chamber plasma region 1120 from a substrate processing region 1170 beneath showerhead 1153. Showerhead 1153 allows a plasma present in chamber plasma region 1120 to avoid directly exciting gases in substrate processing region 1170, while still allowing excited species to travel from chamber plasma region 1120 into substrate processing region 1170.

Showerhead 1153 is positioned between chamber plasma region 1120 and substrate processing region 1170 and allows plasma effluents (excited derivatives of precursors or other gases) created within chamber plasma region 1120 to pass through a plurality of through holes 1156 that traverse the thickness of the plate. The showerhead 1153 also has one or more hollow volumes 1151 which can be filled with a precursor in the form of a vapor or gas (such as a silicon-and-carbon-containing precursor) and pass through small holes 1155 into substrate processing region 1170 but not directly into chamber plasma region 1120. Showerhead 1153 is thicker than the length of the smallest diameter 1150 of the through-holes 1156 in this embodiment. In order to maintain a significant concentration of excited species penetrating from chamber plasma region 1120 to substrate processing region 1170, the length 1126 of the smallest diameter 1150 of the through-holes may be restricted by forming larger diameter portions of through-holes 1156 part way through the showerhead 1153. The length of the smallest diameter 1150 of the through-holes 1156 may be the same order of magnitude as the smallest diameter of the through-holes 1156 or less in embodiments.

In the embodiment shown, showerhead 1153 may distribute (via through holes 1156) process gases which contain oxygen and/or plasma effluents of process gases upon excitation by a plasma in chamber plasma region 1120. In embodiments, the process gas introduced into the RPS 1110 and/or chamber plasma region 1120 through first channel 1112 may contain one or more of oxygen ($O_2$), ozone ($O_3$), $N_2O$, NO, and $NO_2$. However, the oxygen-containing precursor may be devoid of nitrogen, the remote plasma region may be devoid of nitrogen, and the resulting Si—O—C film may commensurately be devoid of nitrogen, in embodiments. The process gas may also include a carrier gas such as helium, argon, nitrogen ($N_2$), etc. The second channel 1113 may also deliver a process gas and/or a carrier gas, and/or a film-curing gas (e.g. $O_3$) used to remove an unwanted component from the growing or as-deposited film. Plasma effluents may include ionized or neutral derivatives of the process gas and may also be referred to herein as a radical-oxygen precursor referring to the atomic constituent of the process gas introduced.

In embodiments, the number of through-holes 1156 may be between about 60 and about 2000. Through-holes 1156 may have a variety of shapes but are most easily made round. The smallest diameter 1150 of through holes 1156 may be between about 0.5 mm and about 20 nun or between about 1 mm and about 6 mm in embodiments. There is also latitude in choosing the cross-sectional shape of through-holes, which may be made conical, cylindrical or a combination of the two shapes. The number of small holes 1155 used to introduce a gas into substrate processing region 1170 may be between about 100 and about 5000 or between about 500 and about 2000 in embodiments. The diameter of the small holes 1155 may be between about 0.1 mm and about 2 mm.

Figure 5B:
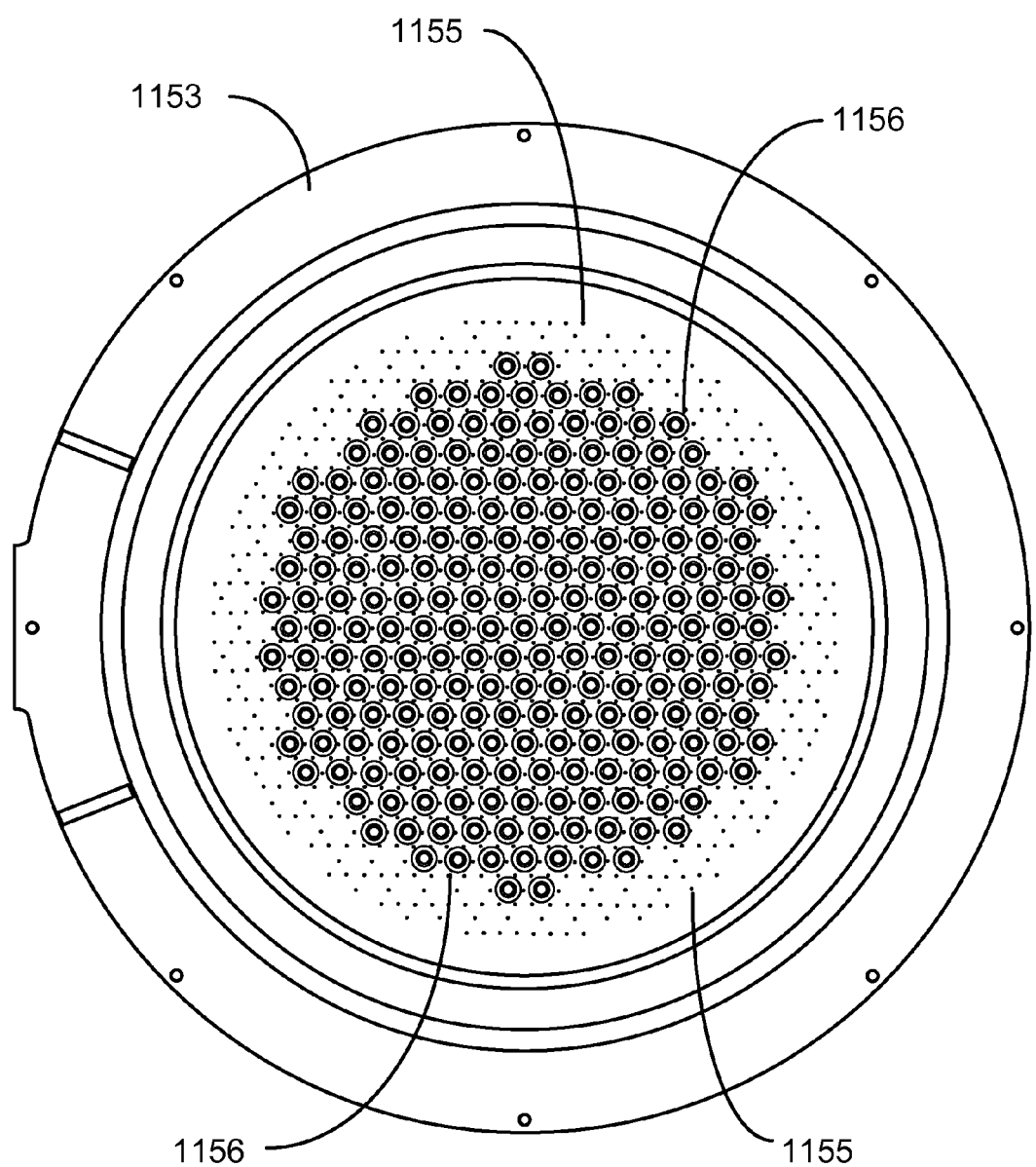
FIG. 5B shows a gas distribution showerhead according to embodiments of the invention.

FIG. 5B is a bottom view of a showerhead 1153 for use with a processing chamber according to embodiments. Showerhead 1153 corresponds with the showerhead shown in FIG. 5A. Through-holes 1156 are depicted with a larger inner-diameter (ID) on the bottom of showerhead 1153 and a smaller ID at the top. Small holes 1155 are distributed substantially evenly over the surface of the showerhead, even amongst the through-holes 1156 which helps to provide more even mixing.

An exemplary film is created on a substrate supported by a pedestal (not shown) within substrate processing region 1170 when plasma effluents arriving through through-holes 1156 in showerhead 1153 combine with a silicon-and-carbon-containing precursor arriving through the small holes 1155 originating from hollow volumes 1151. Though substrate processing region 1170 may be equipped to support a plasma for other processes such as curing, no plasma is present during the growth of the exemplary film.

A plasma may be ignited either in chamber plasma region 1120 above showerhead 1153 or substrate processing region 1170 below showerhead 1153. A plasma is present in chamber plasma region 1120 to produce the radical-oxygen precursor from an inflow of an oxygen-containing gas. An AC voltage typically in the radio frequency (RF) range is applied between the conductive top portion 1121 of the processing chamber and showerhead 1153 to ignite a plasma in chamber plasma region 1120 during deposition. An RF power supply generates a high RF frequency of 13.56 MHz but may also generate other frequencies alone or in combination with the 13.56 MHz frequency. Exemplary RF frequencies include microwave frequencies such as 2.4 GHz. The top plasma power may be greater than or about 1000 Watts, greater than or about 2000 Watts, greater than or about 3000 Watts or greater than or about 4000 Watts in embodiments, during deposition of the flowable film.

The top plasma may be left at low or no power when the bottom plasma in the substrate processing region 1170 is turned on during the second curing stage or clean the interior surfaces bordering substrate processing region 1170. A plasma in substrate processing region 1170 is ignited by applying an AC voltage between showerhead 1153 and the pedestal or bottom of the chamber. A cleaning gas may be introduced into substrate processing region 1170 while the plasma is present.

The pedestal may have a heat exchange channel through which a heat exchange fluid flows to control the temperature of the substrate. This configuration allows the substrate temperature to be cooled or heated to maintain relatively low temperatures (from room temperature through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using an embedded single-loop embedded heater element configured to make two full turns in the form of parallel concentric circles. An outer portion of the heater element may run adjacent to a perimeter of the support platter, while an inner portion runs on the path of a concentric circle having a smaller radius. The wiring to the heater element passes through the stem of the pedestal.

The substrate processing system is controlled by a system controller. In an exemplary embodiment, the system controller includes a hard disk drive, a removable media drive and a processor. The processor contains a single-board computer (SBC), analog and digital input/output boards, interface boards and stepper motor controller boards. The system controller controls all of the activities of the deposition system. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack (e.g. sequential deposition of a silicon-oxygen-and-hydrogen-containing layer and then a silicon-oxygen-and-carbon-containing layer) on a substrate, converting a film to silicon oxide or a process for cleaning a chamber can be implemented using a computer program product that is executed by the system controller. The computer program code can be written in any conventional computer readable programming language: for example, assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled library routines. To execute the linked, compiled object code the system user invokes the object code, causing the computer system to load the code in memory. The CPU then reads and executes the code to perform the tasks identified in the program.

The interface between a user and the controller is via a flat-panel touch-sensitive monitor. In the preferred embodiment two monitors are used, one mounted in the clean room wall for the operators and the other behind the wall for the service technicians. The two monitors may simultaneously display the same information, in which case only one accepts input at a time. To select a particular screen or function, the operator touches a designated area of the touch-sensitive monitor. The touched area changes its highlighted color, or a new menu or screen is displayed, confirming communication between the operator and the touch-sensitive monitor. Other devices, such as a keyboard, mouse, or other pointing or communication device, may be used instead of or in addition to the touch-sensitive monitor to allow the user to communicate with the system controller.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. The term "precursor" is used to refer to any process gas which takes part in a reaction to either remove material from or deposit material onto a surface. A gas in an "excited state" describes a gas wherein at least some of the gas molecules are in vibrationally-excited, dissociated and/or ionized states. A gas (or precursor) may be a combination of two or more gases (or precursors). A "radical precursor" is used to describe plasma effluents (a gas in an excited state which is exiting a plasma) which participate in a reaction to either remove material from or deposit material on a surface. A "radical-oxygen precursor" is a radical precursor which contains oxygen and may be nitrogen-free in embodiments. The phrase "inert gas" refers to any gas which does not form chemical bonds when etching or being incorporated into a film. Exemplary inert gases include noble gases but may include other gases so long as no chemical bonds are formed when (typically) trace amounts are trapped in a film.

The terms "gap" or "trench" are used throughout with no implication that the etched geometry has a large horizontal aspect ratio. Viewed from above the surface, gaps and trenches may appear circular, oval, polygonal, rectangular, or a variety of other shapes. As used herein, a conformal layer refers to a generally uniform layer of material on a surface in the same shape as the surface, i.e., the surface of the layer and the surface being covered are generally parallel. A person having ordinary skill in the art will recognize that the deposited material likely cannot be 100% conformal and thus the term "generally" allows for acceptable tolerances.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

The invention claimed is:

1. A method of filling a trench, the method comprising:
    transferring a patterned substrate comprising the trench into a substrate processing region of a substrate processing chamber;
    flowing an oxygen-containing precursor into a remote plasma region while igniting a remote plasma to form a radical-oxygen precursor;
    flowing the radical oxygen precursor into the substrate processing region;
    flowing a first silicon-and-carbon-containing precursor into the substrate processing region without first passing the first silicon-and-carbon-containing precursor through a plasma, wherein the first silicon-and-carbon-containing precursor has a Si—O:Si ratio of less than 3;
    flowing a second silicon-and-carbon-containing precursor into the substrate processing region without first passing the second silicon-and-carbon-containing precursor through a plasma, wherein the second silicon-and-carbon-containing precursor has a Si—O: Si ratio of greater than 2;
    combining the first silicon-and-carbon-containing precursor, the second silicon-and-carbon-containing precursor and the radical oxygen precursor in the substrate processing region to form a low-k dielectric layer on the patterned substrate, wherein a portion of the low-k dielectric layer deposits on the substrate and flows along the surface during formation of the low-k dielectric layer to fill the trench, and wherein a partial pressure ratio of the first silicon-and-carbon-containing precursor to the second silicon-and-carbon-containing precursor within the substrate processing region is reduced during formation of the low-k dielectric layer, wherein a second partial pressure ratio of the first silicon-and-carbon-containing precursor to the second silicon-and-carbon-containing precursor measured in the substrate processing region at the end of the formation of the low-k dielectric layer is less than a first partial pressure ratio at the beginning of the formation of the low-k dielectric layer by at least 25%; and
    solidifying the low-k dielectric layer within the trench.

2. The method of claim 1, wherein the low-k dielectric layer has a dielectric constant of between 2.2 and 3.0 following solidification.

3. The method of claim 1, wherein a temperature of the substrate during formation of the low-k dielectric layer is less than 150° C.

4. The method of claim 1, wherein the first silicon-and-carbon-containing precursor is octamethylcyclotetrasiloxane or tetramethylcyclotetrasiloxane.

5. The method of claim 1, wherein the first silicon-and-carbon-containing precursor has a Si—O:Si ratio of 1.

6. The method of claim 1, wherein the second silicon-and-carbon-containing precursor has a Si—O:Si ratio of 4.

7. The method of claim 1, wherein the second silicon-and-carbon-containing precursor is tetramethyl orthosilicate.

* * * * *